US006950524B2

(12) United States Patent
Nelson et al.

(10) Patent No.: US 6,950,524 B2
(45) Date of Patent: Sep. 27, 2005

(54) OPTIMAL SOURCE DISTRIBUTION

(75) Inventors: Philip Arthur Nelson, Romsey (GB); Takashi Takeuchi, Tokyo (JP)

(73) Assignee: Adaptive Audio Limited, Romsey (GB)

( * ) Notice: Subject to any disclaimer, the term of this patent is extended or adjusted under 35 U.S.C. 154(b) by 69 days.

(21) Appl. No.: 10/312,224

(22) PCT Filed: Jun. 22, 2001

(86) PCT No.: PCT/GB01/02759

§ 371 (c)(1),
(2), (4) Date: Mar. 7, 2003

(87) PCT Pub. No.: WO02/01916

PCT Pub. Date: Jan. 3, 2002

(65) Prior Publication Data

US 2003/0161478 A1 Aug. 28, 2003

(30) Foreign Application Priority Data

Jun. 24, 2000 (GB) ............................................ 0015419

(51) Int. Cl.[7] .......................... H04R 5/00; H04R 29/00; H04R 5/02; H03G 5/00

(52) U.S. Cl. ............................ 381/17; 381/98; 381/99; 381/58; 381/59; 381/307

(58) Field of Search ............................... 381/17, 58–59, 381/98–99, 307, 310, 1, 61

(56) References Cited

U.S. PATENT DOCUMENTS 6,633,648 B1 * 10/2003 Bauck ........................ 381/303

FOREIGN PATENT DOCUMENTS

| | | |
|---|---|---|
| GB | 9603236.2 | 2/1996 |
| WO | WO 97 30566 A | 8/1997 |
| WO | WO 98 54926 A | 12/1998 |

OTHER PUBLICATIONS

H. Moller, Fundamentals of Binaural Technology, 1992, Appl. Acoust. 36, pp. 171–218.*

D. R. Begault, 3–D Sound for Virtual Reality and Multimedia, 1994, (AP Professional, Cambridge, MA).*

P. Damaske, Head–related Two–channel Sterephony with Reproduction, 1971, J. Acoust. Soc. Am. 50, 1109–1115.*

P. A. Nelson, O. Kirbeby, T. Takeuchi, and H. Hamada, Sound fields for the production f virtual acoustic images, 1997, J. Sound. Vib. 240(2), 386–396.*

(Continued)

*Primary Examiner*—Laura A. Grier
(74) *Attorney, Agent, or Firm*—Christensen O'Connor Johnson Kindness PLLC

(57) ABSTRACT

A sound reproduction system has pairs of sound emitters that subtend different angles Θ, the span angle, at the listener position. The pairs of sound emitters are arranged to be excited by different frequency bands of the signal output from an inverse filter means ($H_h$, $H_l$). The operational span-frequency range of the pairs of sound emitters is determined by an equation (I) where the transducer span Θ is the angle subtended at the listener by a pair of transducers, where O<n<2. $c_0$: is the speed of sound, and Δr: is the equivalent distance between the ears. The sound emitters may be discrete speaker units, the different pairs of units being positioned at different span angles, or they be constituted by area portions of an extended transducer (FIG. 10). When discrete speaker units are employed a cross-over filter (FIG. 28) is used to provide drive signals in the different frequency bands to the different speaker pairs. When an extended transducer is employed, the vibration transmission characteristics of the transducer may be arranged to filter the vibrations transmitted along the transducer from an excitation means positioned at the higher frequency emitting end of the transducer.

15 Claims, 30 Drawing Sheets

OTHER PUBLICATIONS

P. A. Nelson, F. Orduna–Bustamante, and H. Hamada, Inverse Filter Design and Equalisation ZOnes in Multi–Channel Sound Reproduction, 1995, IEEE Trans. Speech Audio Process. 3(3), pp. 185–192.*

B. Gardner, and K. Martin, HRTF Measurement of a KEMAR Dummy–Head Microphone, 1994, MIT Media Lab Perceptual Computing—Technical Report No. 280.*

O. Kirkeby, P. A. Nelson, F. Orduna–Bustamante, and H. Hamada, Local Sound Field Reproduction Using Digital Signal Processing, 1996, J. Acoust. Soc. Am. 100, pp. 1584–1593.*

Bauck, J., et al., "Generalized Transaural Stereo and Applications," *Journal of the Audio Engineering Society*, 44(9):683–705, Sep. 1, 1996.

Hamada, H., et al., "Relation between physical characteristics of orthostereophonic system and horizontal plane localization," *J. Acoust. Soc. Jpn.* (E)6(3):143–154, 1985.

Schroeder, M.R., and B.S. Atal, "Computer Simulation of Sound Transmission in Rooms," *IEEE Conv. Record* 7:150–155, 1963.

Takeuchi, T., et al., "Influence of Individual Head Related Transfer Function on the Performance of Virtual Acoustic Imaging Systems" *Proceedings of the AES 104th Convention*, Amsterdam, May 16–19, 1998, pp. 1–18.

* cited by examiner

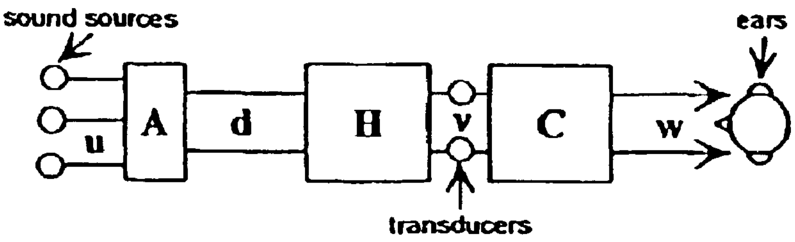
Fig. 1 Block diagram for multi-channel sound control with system inversion

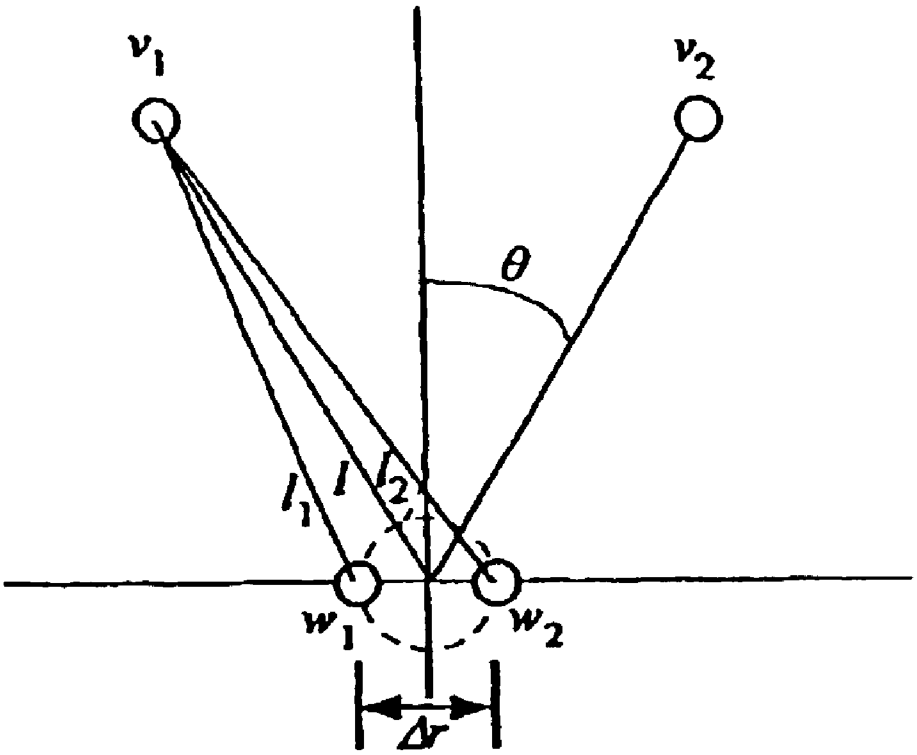
Fig. 2 The geometry of a 2-source 2-receiver system under investigation.

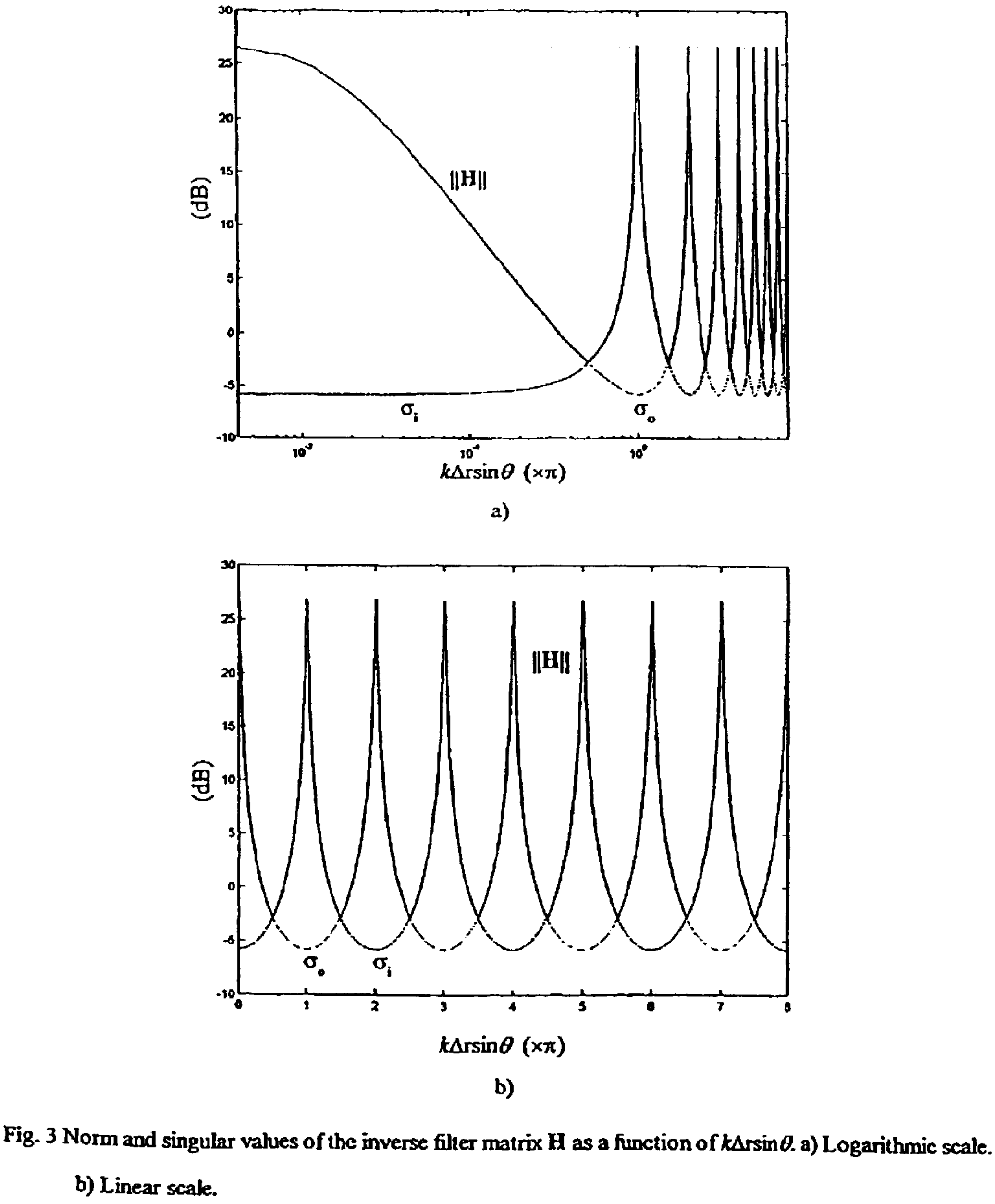
Fig. 3 Norm and singular values of the inverse filter matrix H as a function of $k\Delta r\sin\theta$. a) Logarithmic scale. b) Linear scale.

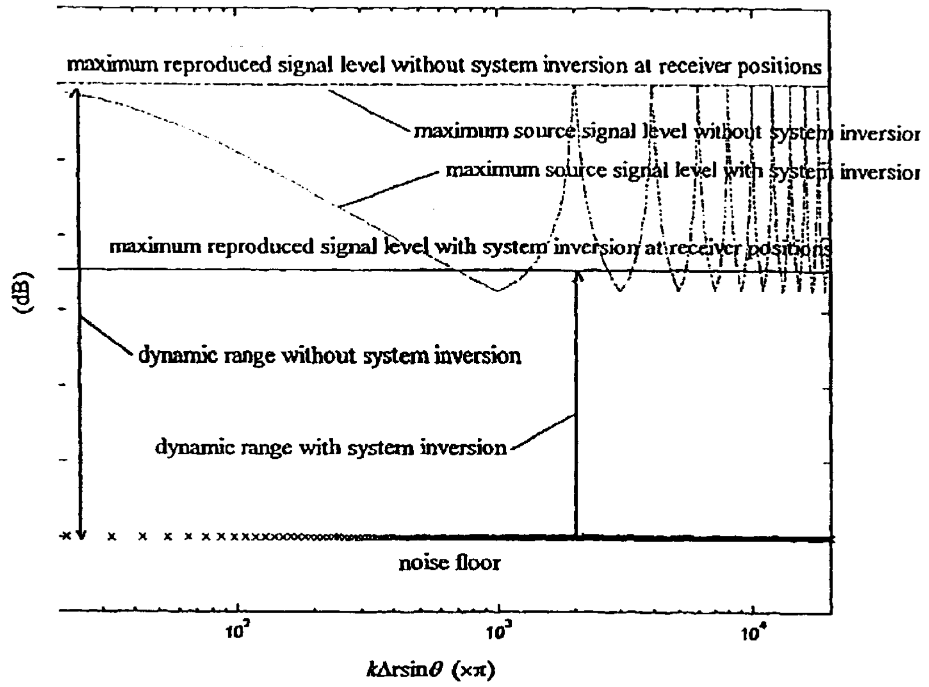
Fig. 4 Dynamic range loss due to system inversion.
Source signal levels are normalised by the maximum source signal level without system inversion a 0 dB.
Reproduced signal levels are normalised by the reproduced signal level without system inversion a 0 dB.
Noise floor is plotted at -60dB for an aid to illustrate dynamic range.

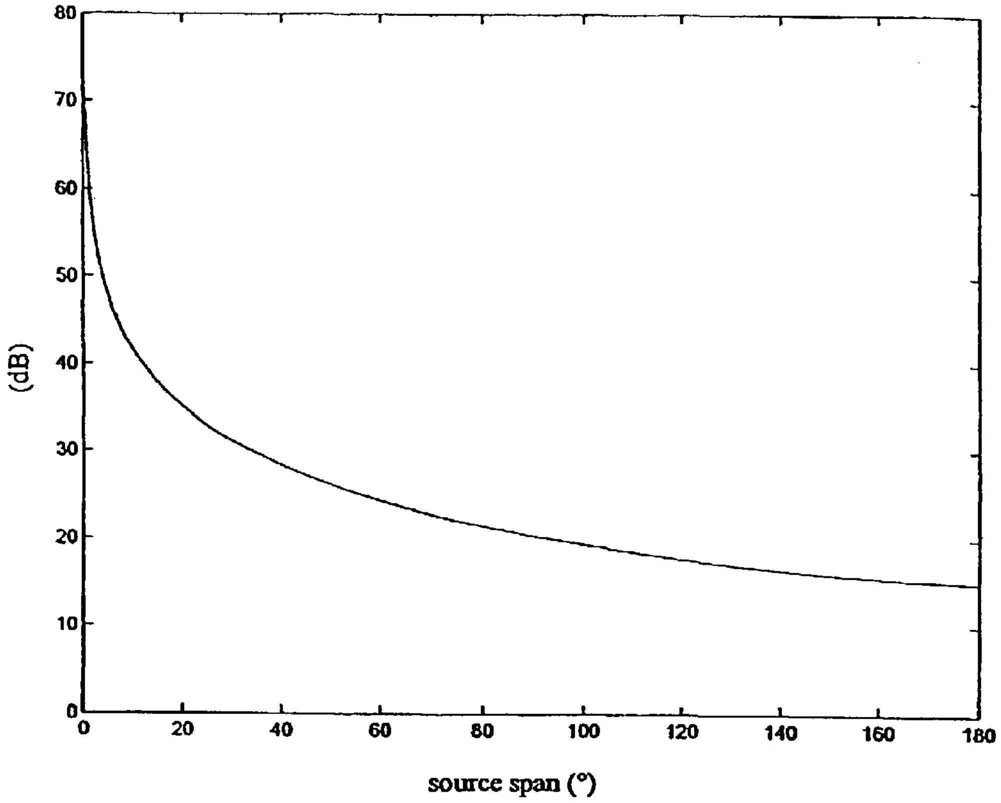
Fig. 5 Dynamic range loss as a function of source span.

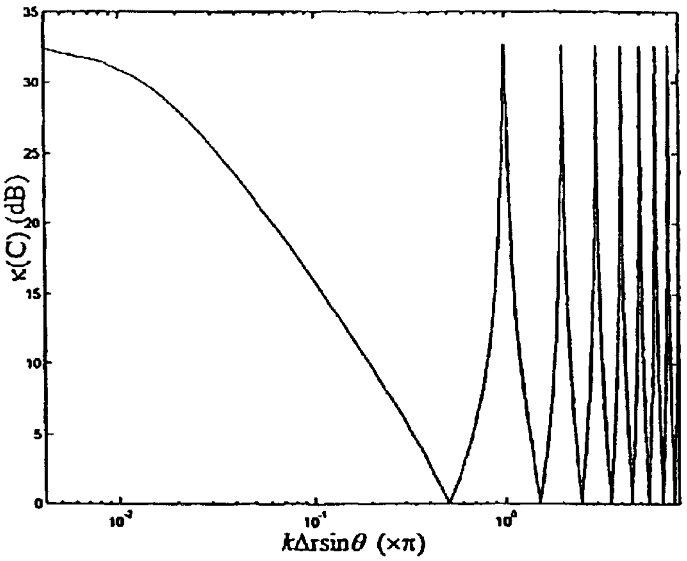
a)
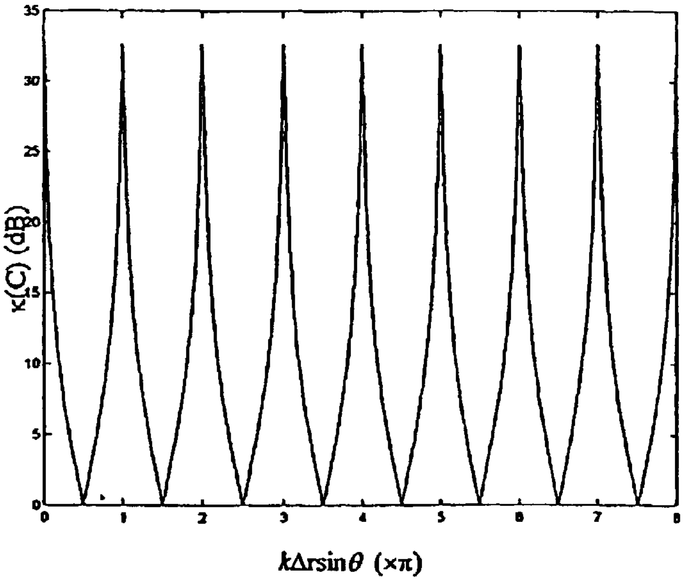
b)
Fig. 6 Condition number κ(C) as a function of $k\Delta r\sin\theta$. a) Logarithmic scale. b) Linear scale.

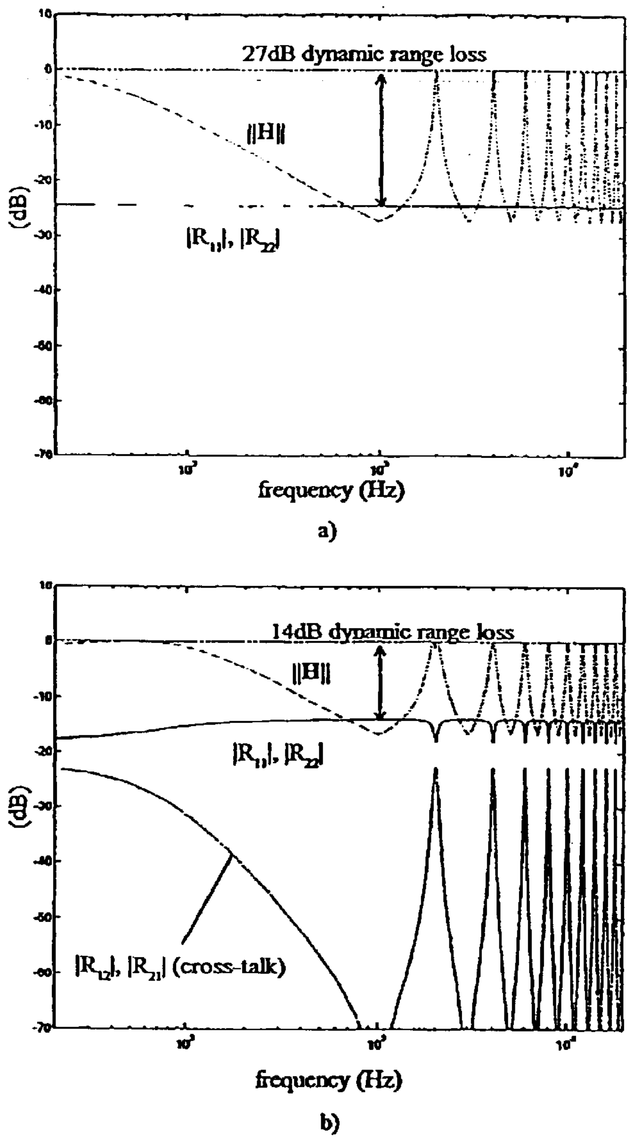
Fig. 7 Dynamic range improvement and loss of control performance with regularisation. a) Without regularisation. b) With regularisation

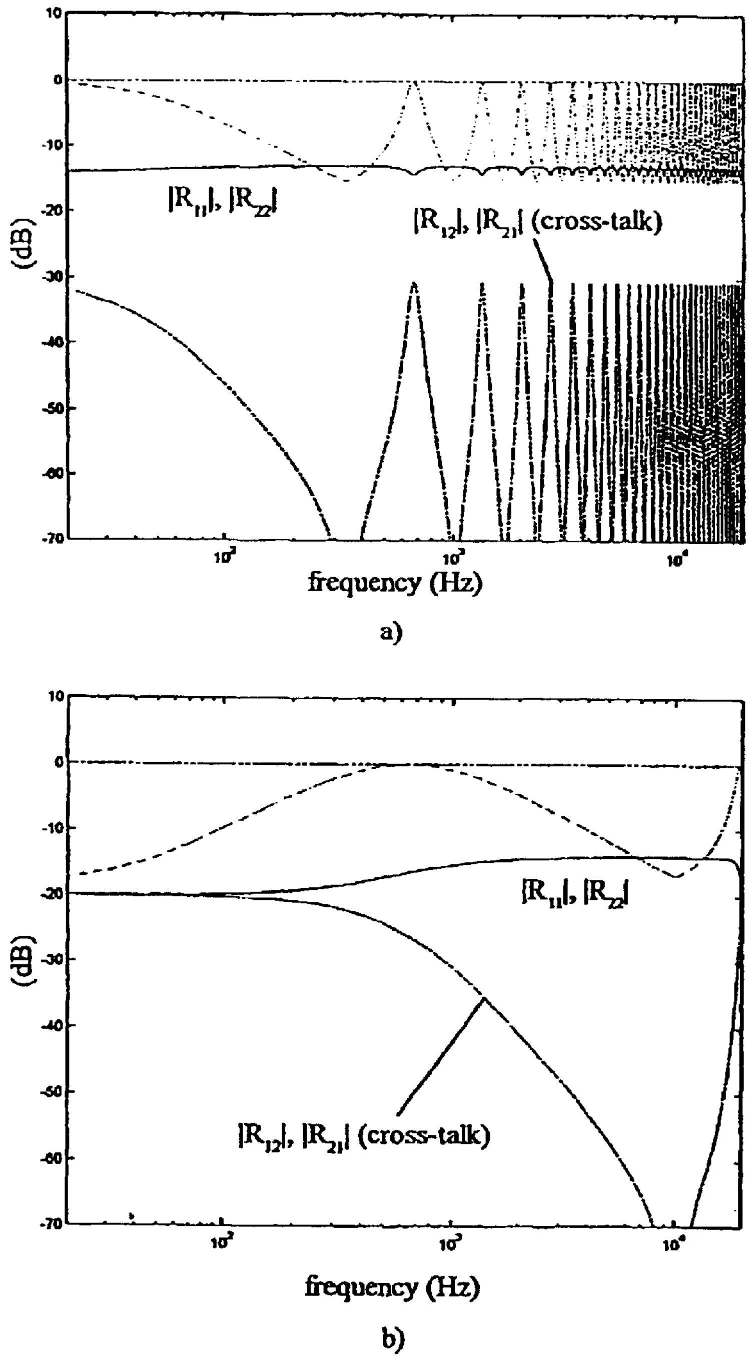
Fig. 8 Effect of changing source span. a) Larger source span. b) Smaller source span.

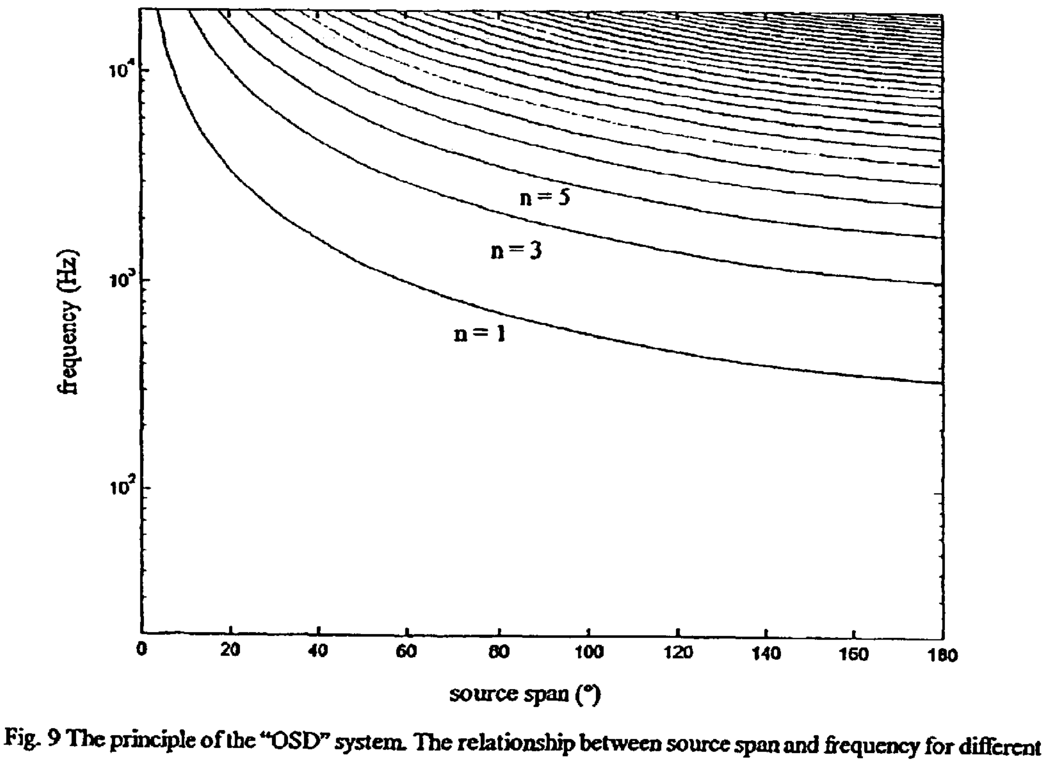
Fig. 9 The principle of the "OSD" system. The relationship between source span and frequency for different odd integer number n.

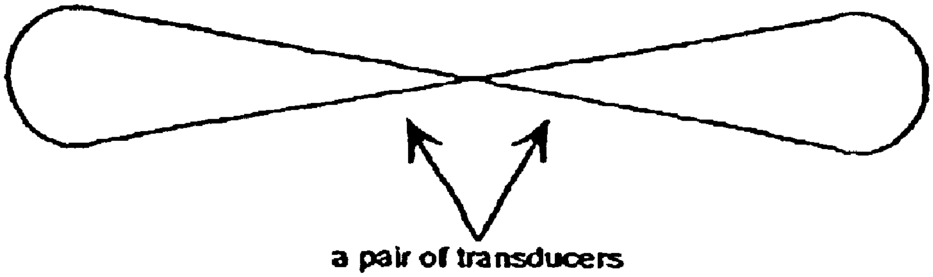
Fig. 10 Variable position (span) / frequency transducer.

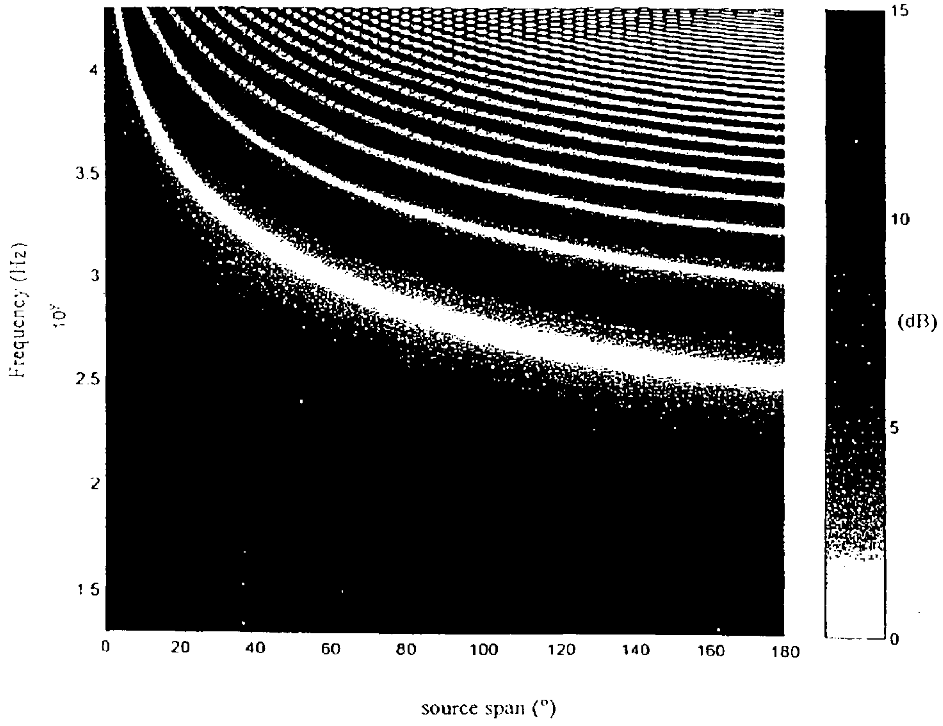
Fig. 11 Condition number κ(C) of a free field plant matrix C as a function of source span and frequency.

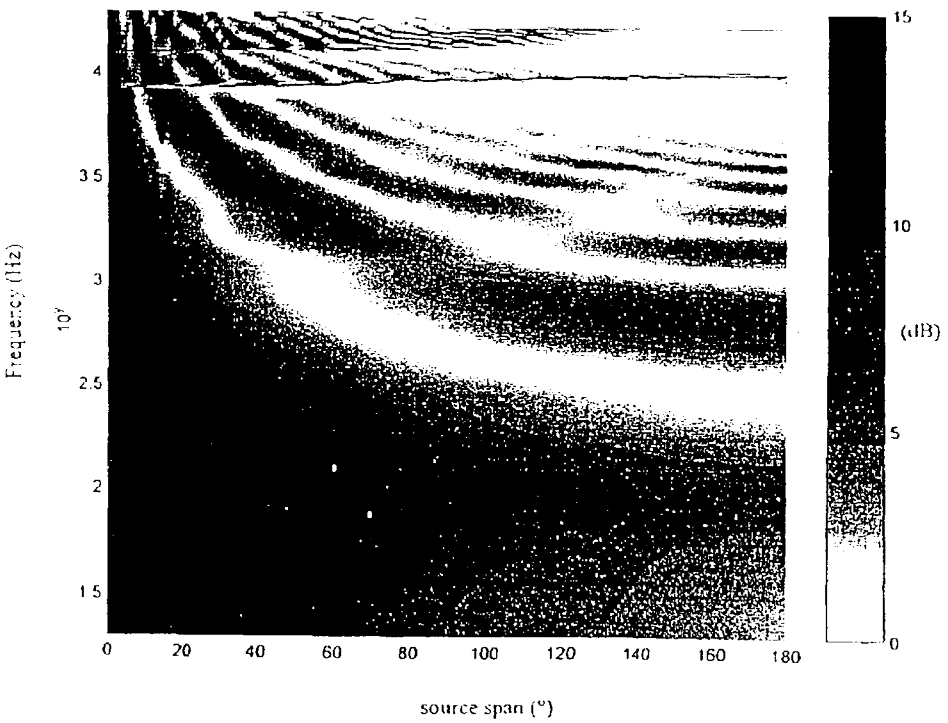
Fig. 12 Condition number κ(C) of a HRTFs plant matrix C as a function of source span and frequency.

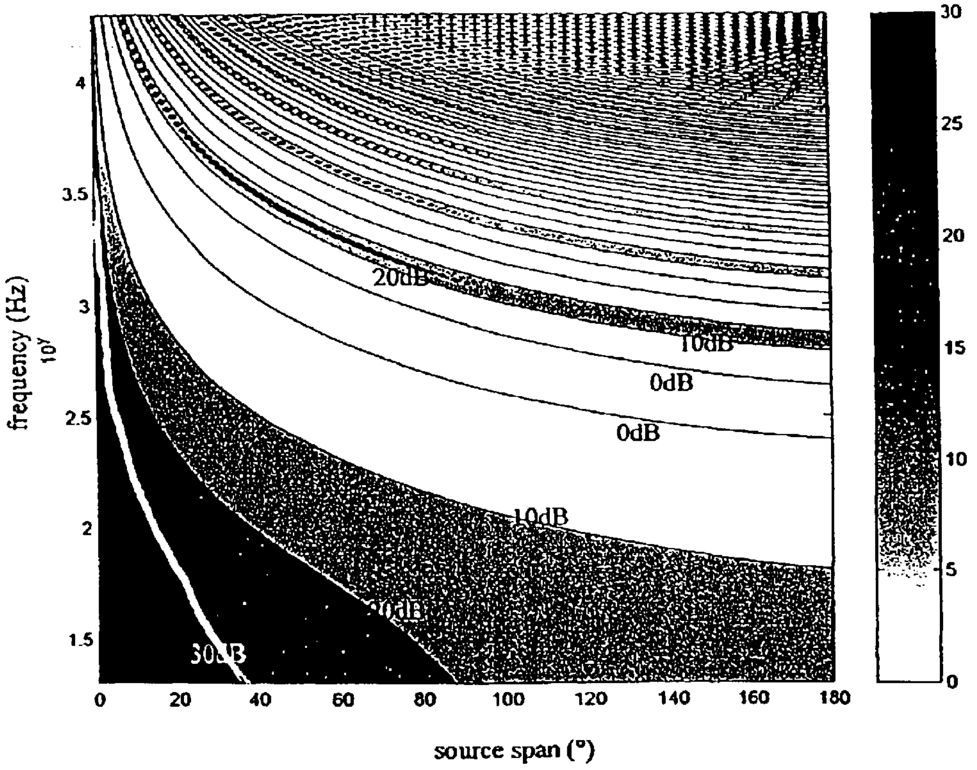
Fig. 13 Dynamic range loss as a function of source span and frequency range.

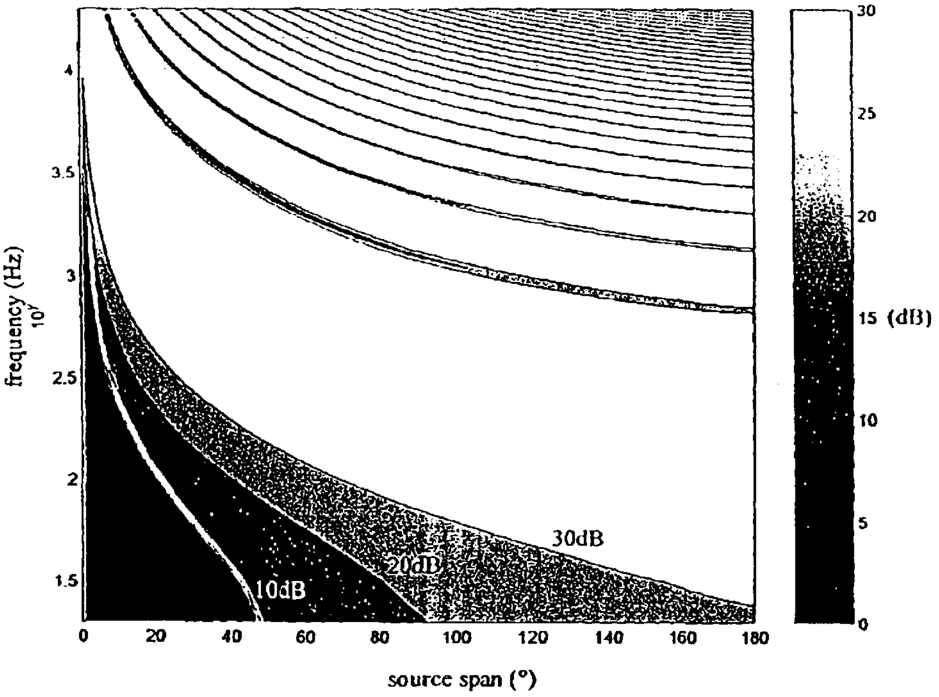
Fig. 14 Cross-talk cancellation performance as a function of source span and frequency with regularisation for 20dB dynamic range loss.

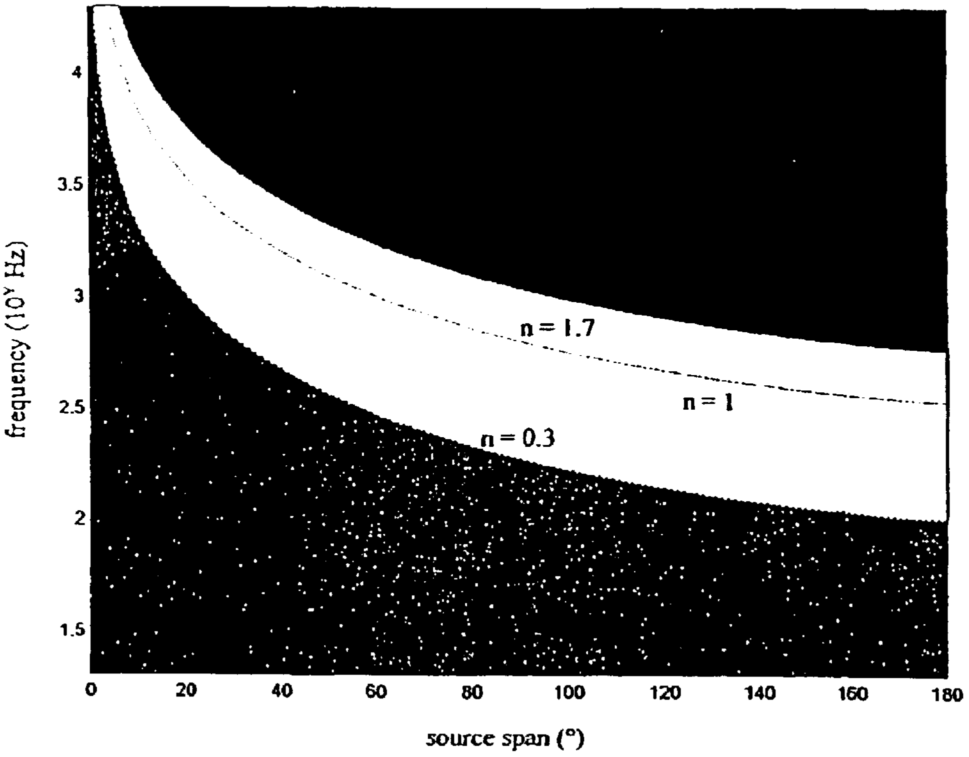
Fig. 15 The frequency/span region for systems with $n \approx 1$ and $\nu = 0.7$, and an example of discretisation for a 3-way system.
white area: $0.3 < n < 1.7$
grey area: $f < f_l$

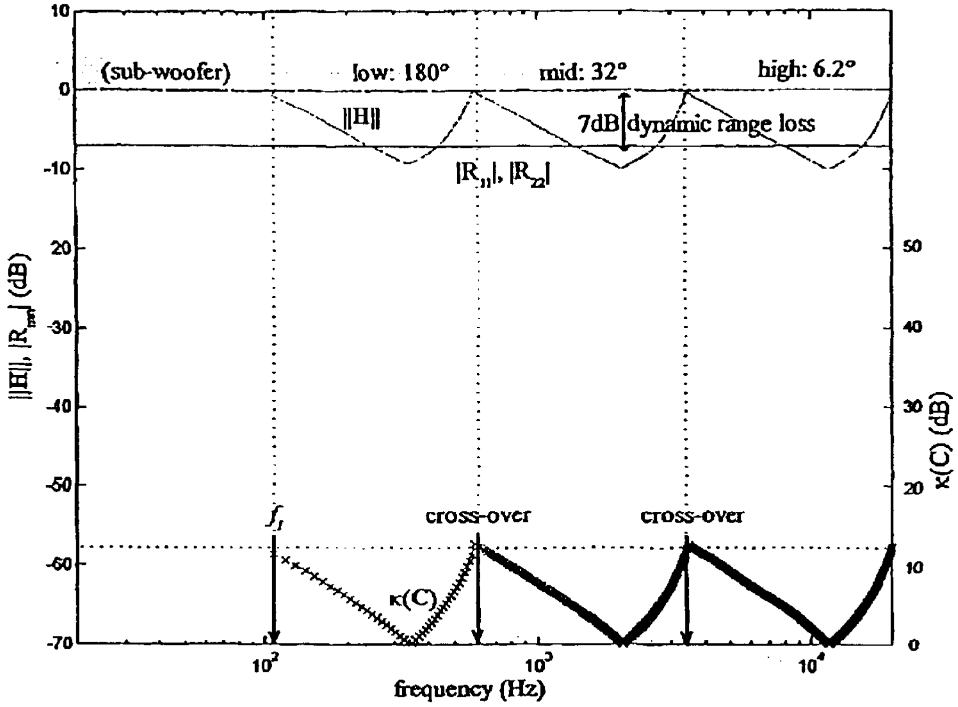
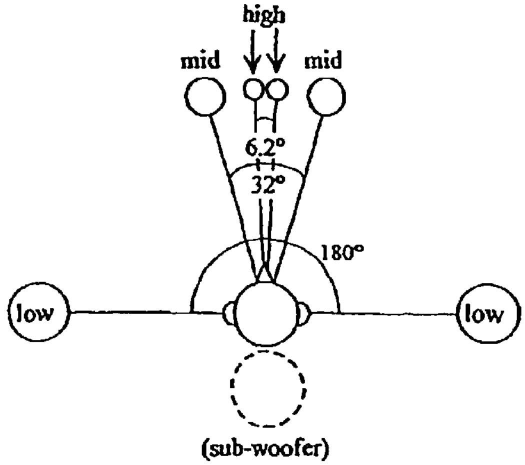
Fig. 16 An example of 3-way system with $n \approx 1$ and $\nu = 0.7$.
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number κ(C)

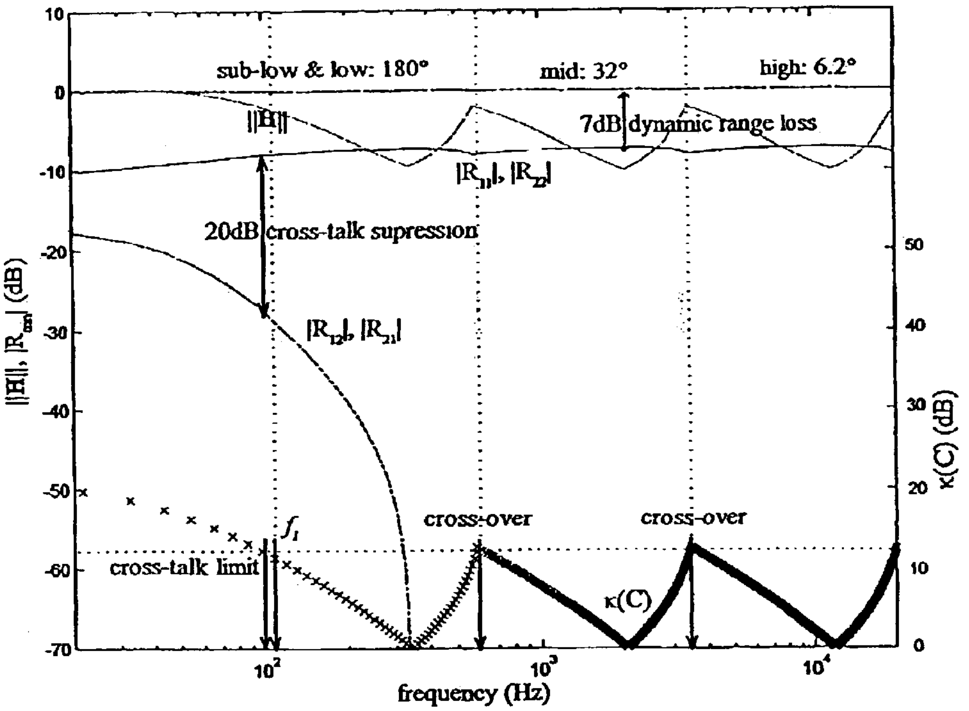
Fig. 17 an example of 3-way system with regularisation for 7dB dynamic range loss
....... source signal level with system inversion (||H||)
—— reproduced signal level with the correct desired signal (|R11|, |R22|)
- - - reproduced signal level with the wrong desired signal (|R12|, |R21|, cross-talk)
xxxx condition number κ(C)
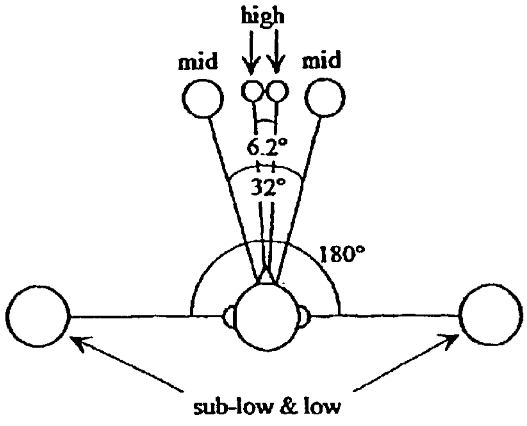

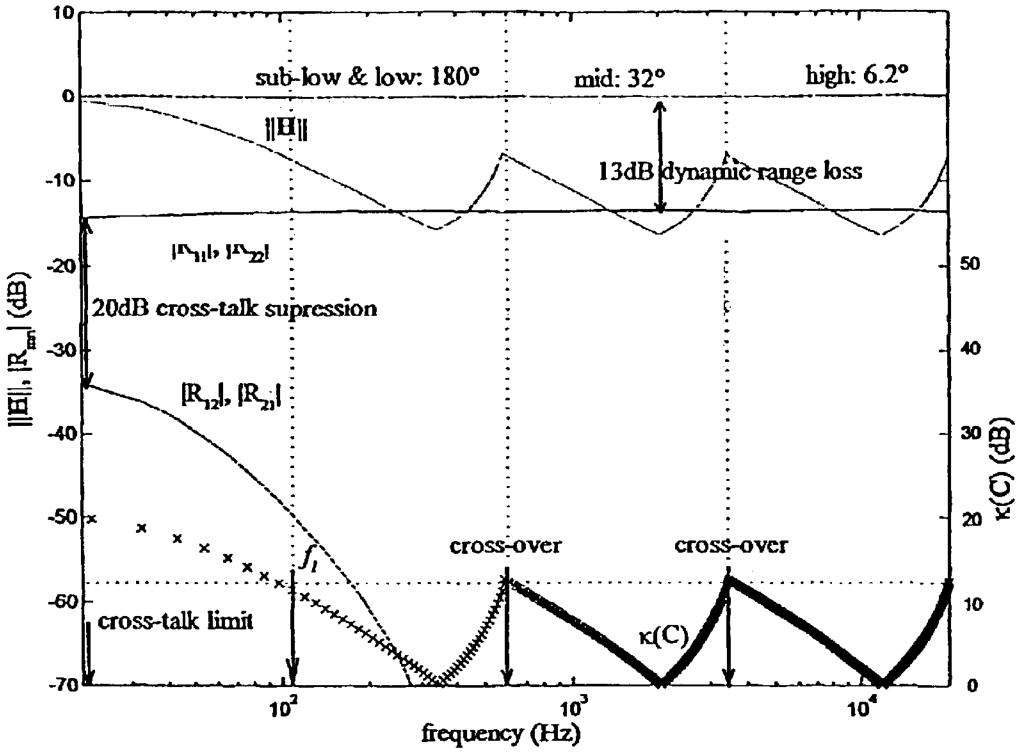
Fig. 18 an example of 3-way system with regularisation for 13dB dynamic range loss
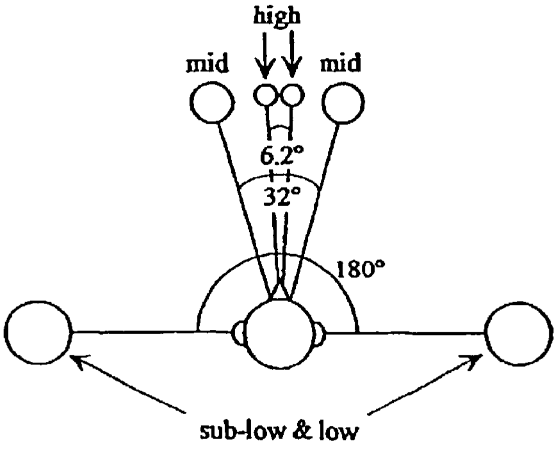
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number κ(C)

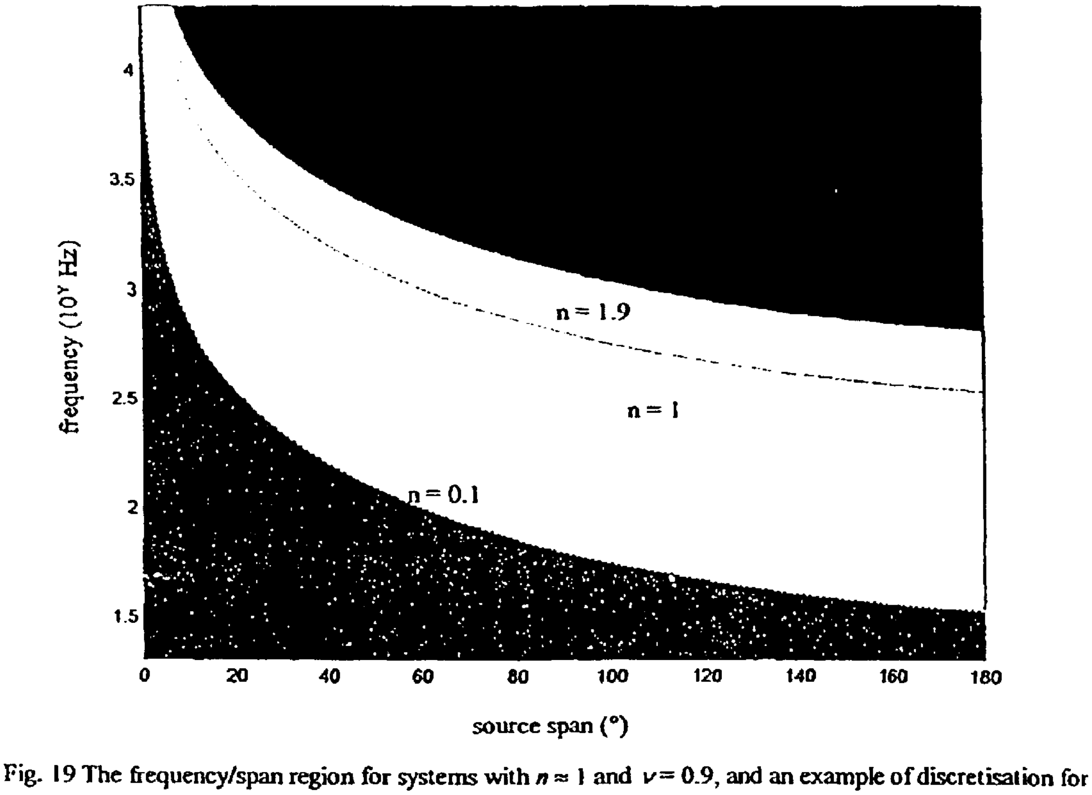
Fig. 19 The frequency/span region for systems with $n \approx 1$ and $\nu = 0.9$, and an example of discretisation for a 2-way system.
white area: $0.1 < n < 1.9$
grey area: $f < f_l$

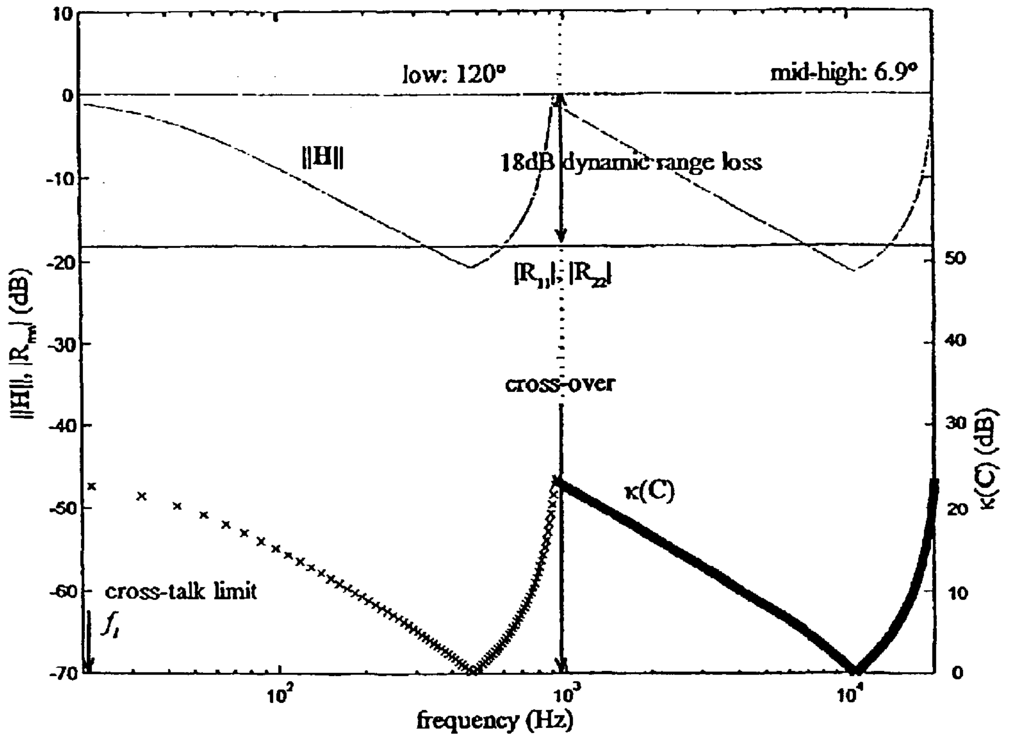
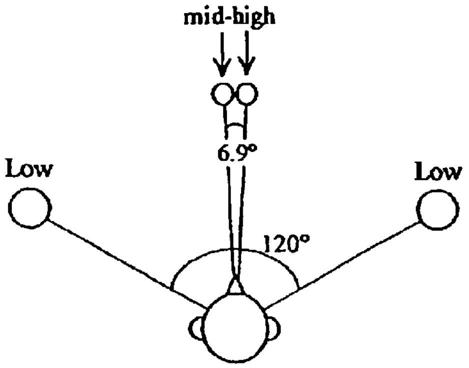
Fig. 20 An example of 2-way system with $n \approx 1$ and $\nu = 0.9$.
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number $\kappa(C)$

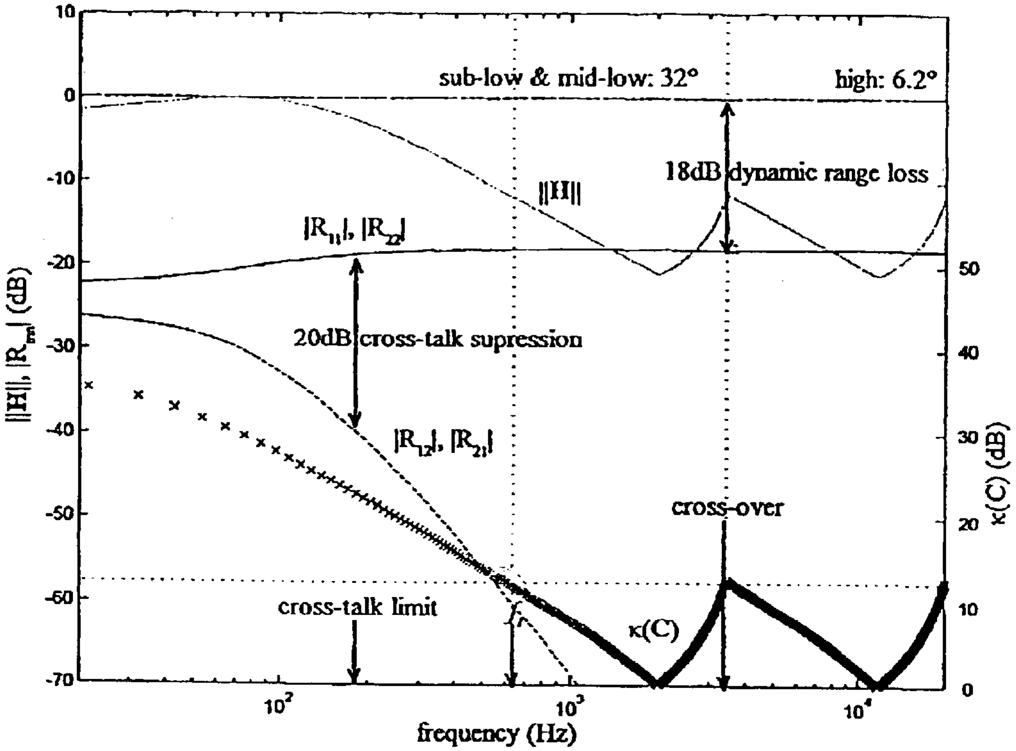
Fig. 21 An example of 2-way system with $n \approx 1$ and $\nu = 0.7$ with regularisation for 18dB dynamic range loss.
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number κ(C)
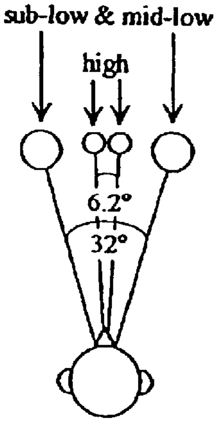

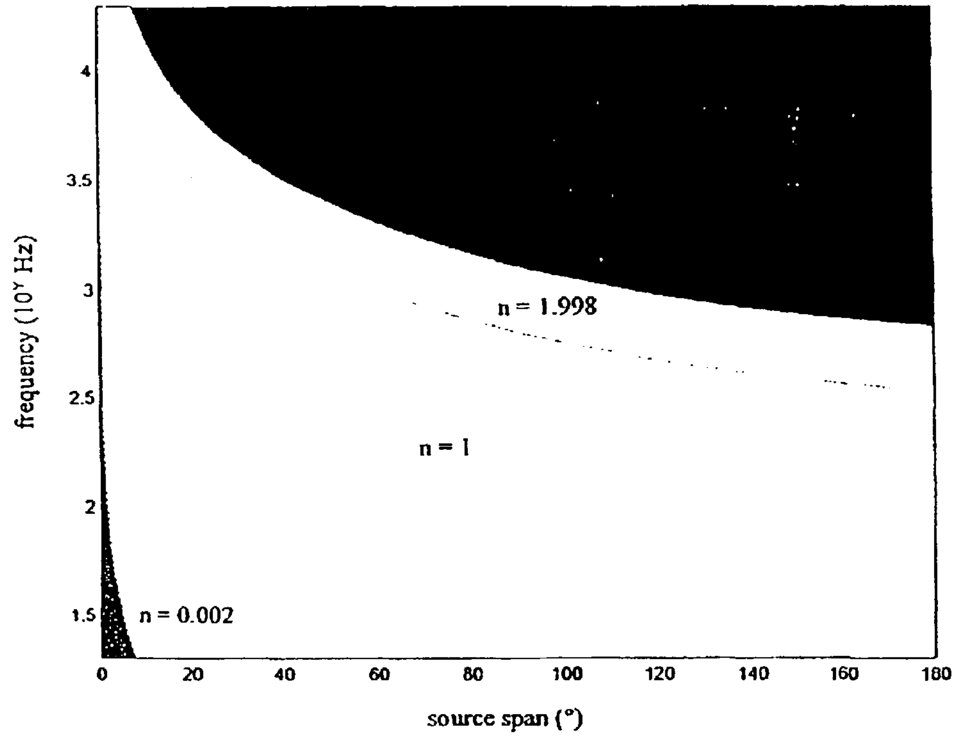
Fig. 22 The frequency/span region for systems with $n \approx 1$ and $v = 0.998$, and an example of discretisation for a 1-way system.
white area: $0.002 < n < 1.998$
grey area: $f < f_1$

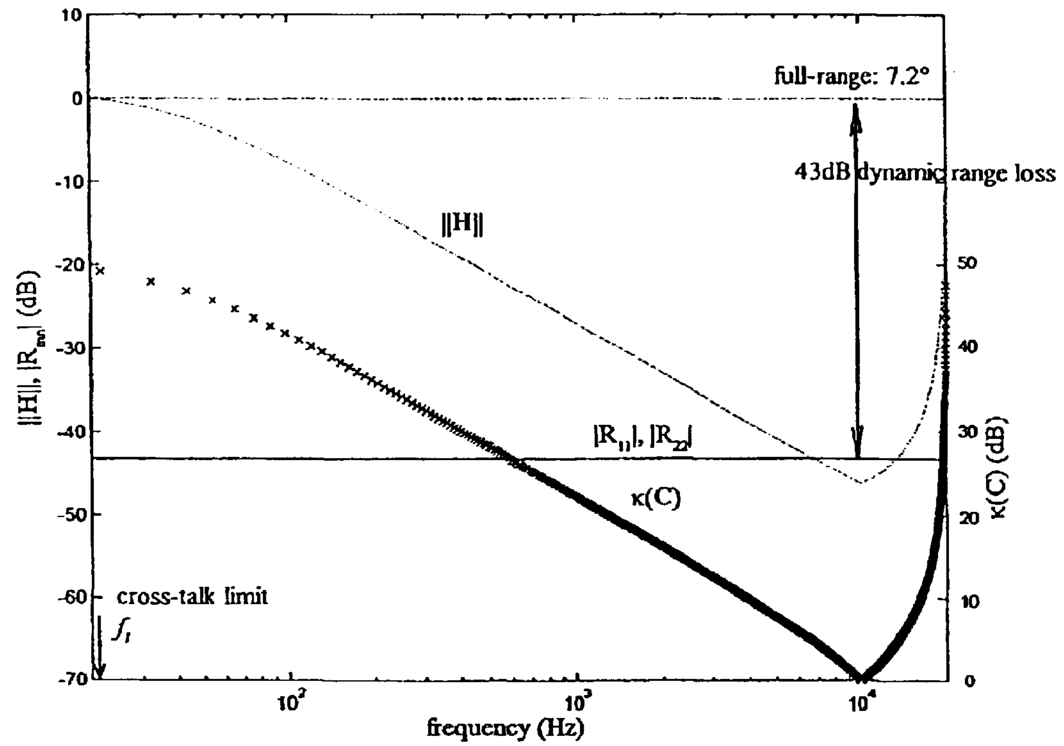
Fig. 23 An example of 1-way system with $n \approx 1$ and $\nu = 0.998$.
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number $\kappa(C)$
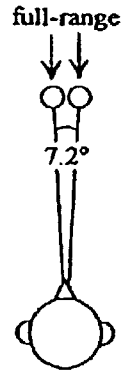

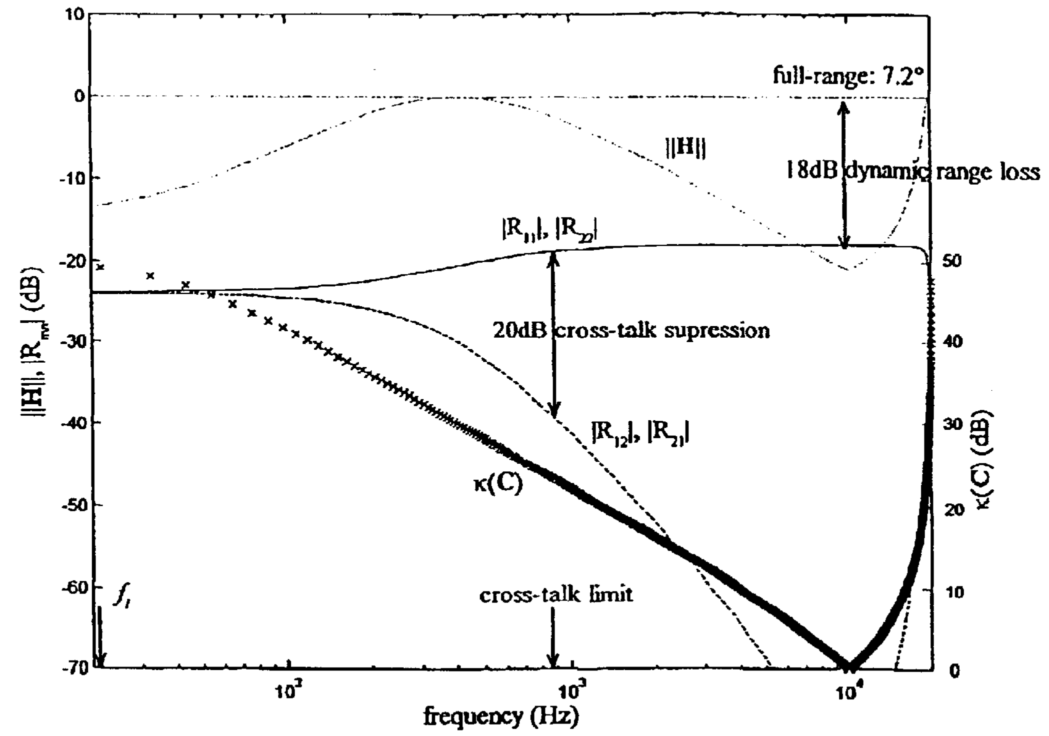
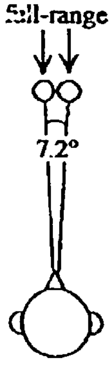
Fig. 24 An example of 1-way system with $n \approx 1$ and $\nu = 0.998$ with regularisation for 18dB dynamic range loss.
....... source signal level with system inversion ($||H||$)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number κ(C)

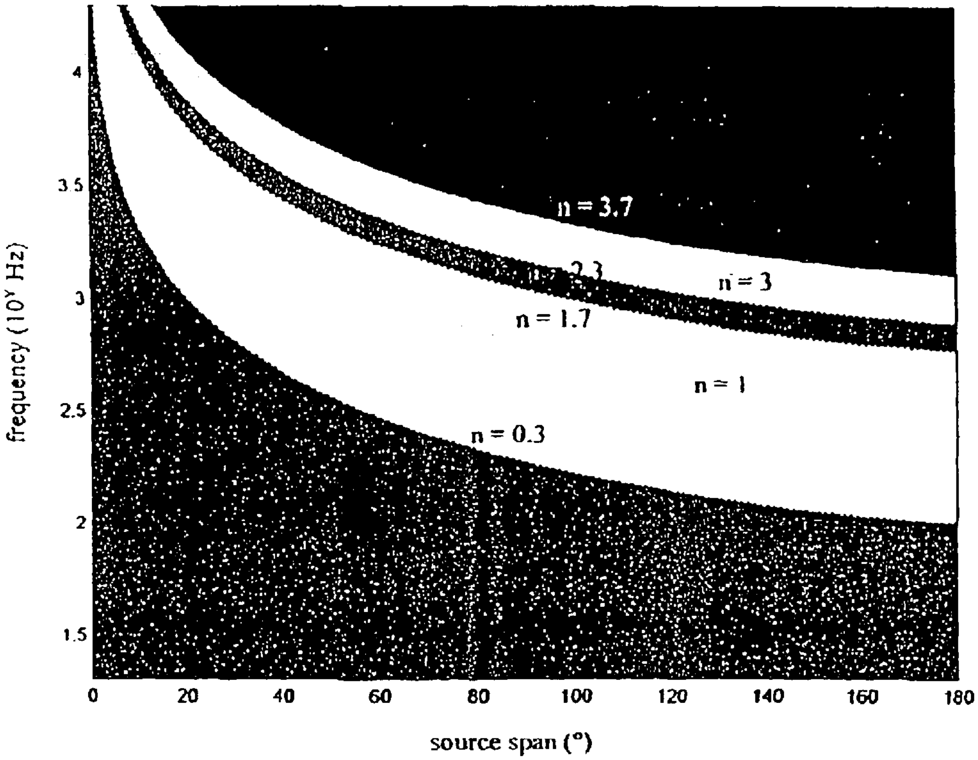
Fig. 25 The frequency/span region for a multi-region systems with n ≈ 1 and n ≈ 3 with $\nu$ = 0.7, and an example of discretisation for a 1-way system.
white area: 0.3 < $n$ < 1.7
grey area: $f < f_l(n \approx 1)$ and $f_h(n \gg 1) < f < f_l(n \approx 3)$

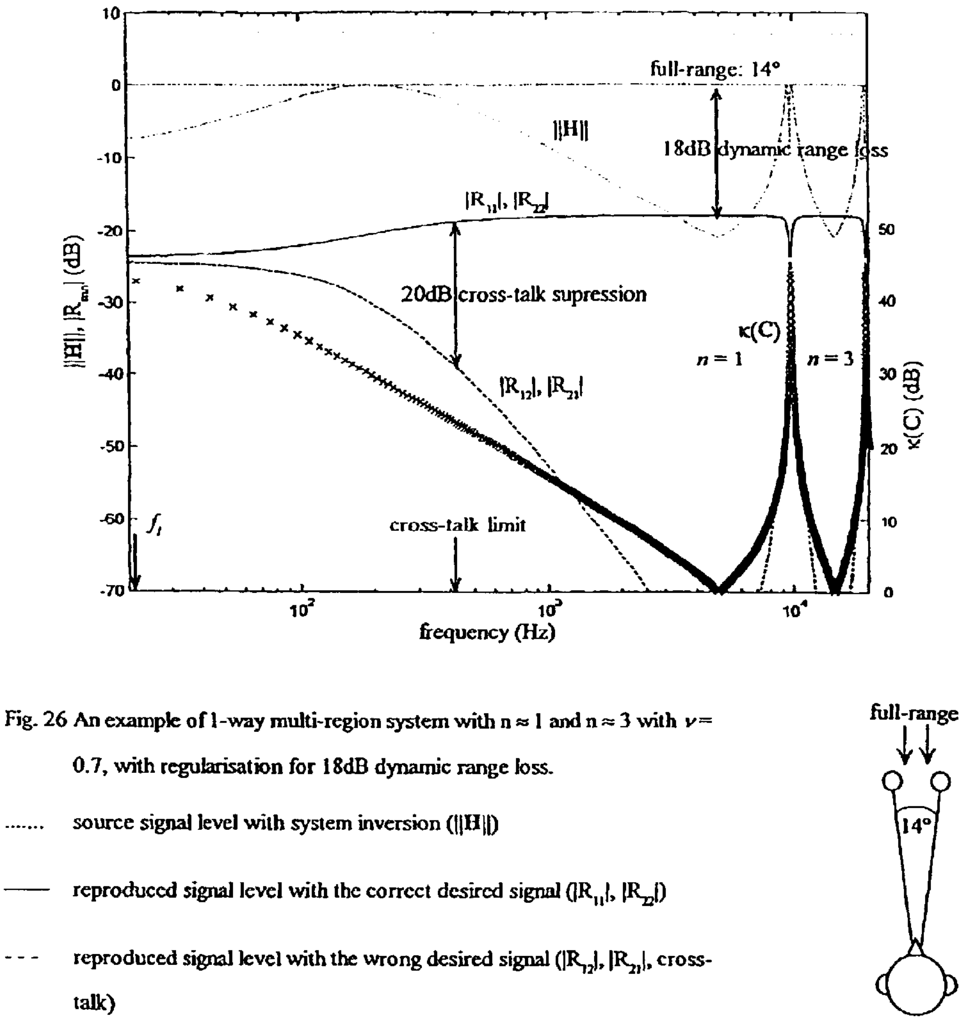
Fig. 26 An example of 1-way multi-region system with n ≈ 1 and n ≈ 3 with $\nu$ = 0.7, with regularisation for 18dB dynamic range loss.
....... source signal level with system inversion (||H||)
—— reproduced signal level with the correct desired signal ($|R_{11}|$, $|R_{22}|$)
- - - reproduced signal level with the wrong desired signal ($|R_{12}|$, $|R_{21}|$, cross-talk)
xxxx condition number κ(C)

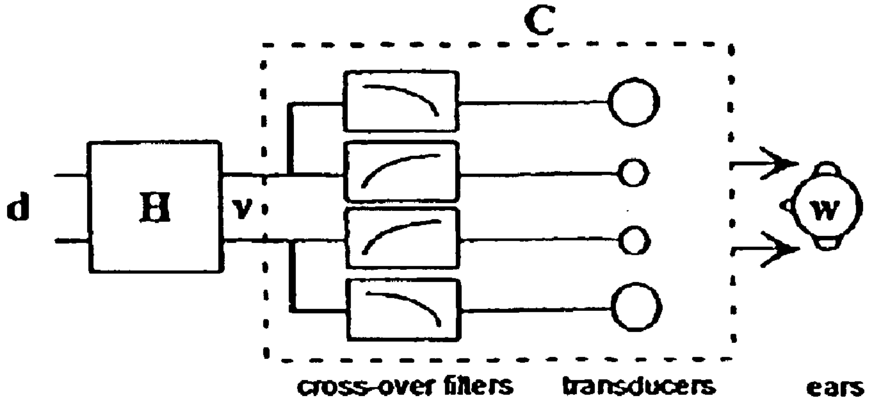
Fig. 27 Block diagrams for cross-over filters and inverse filters when a 2 by 2 plant matrix C is used to design inverse filters.

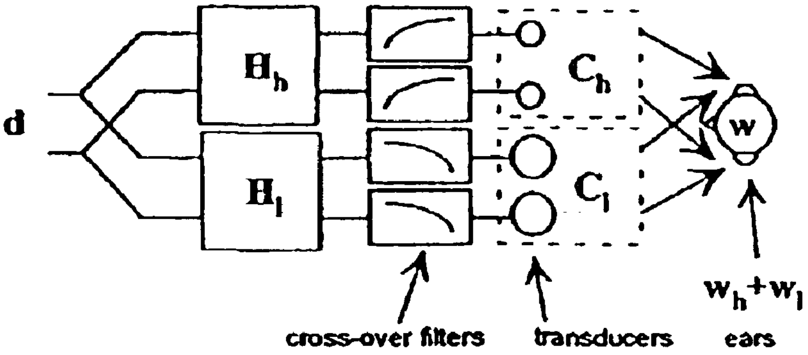
a)
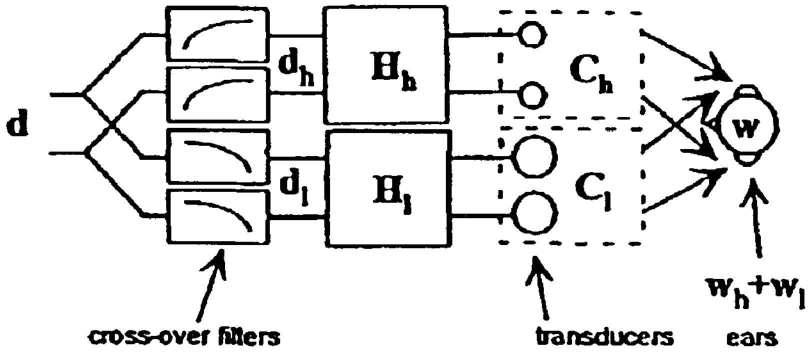
b)
Fig. 28 Block diagrams for cross-over filters and inverse filters when *m* (number of driver pairs) of 2 by 2 plant matrices C are used separately to design *m* inverse filter matrices. a) Cross-over filters after inverse filters. b) Cross-over filters prior to inverse filters.

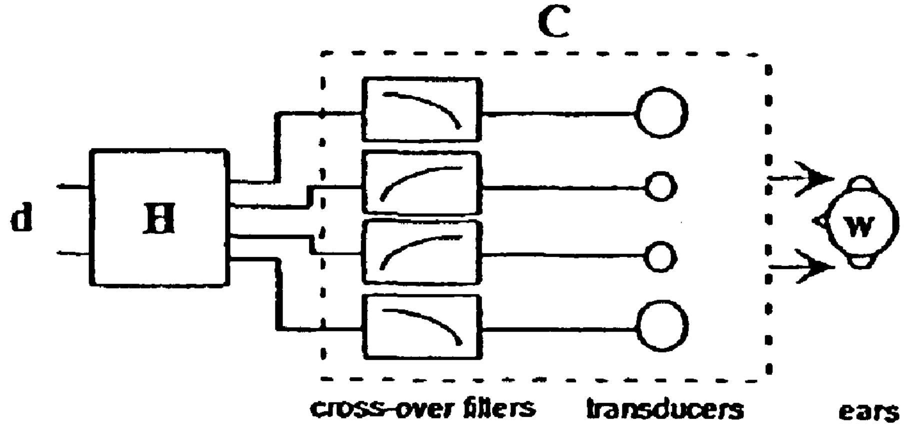
Fig. 29 Block diagrams for cross-over filters and inverse filters when a 2 by (2 × *m*) plant matrix C is used to design inverse filters.

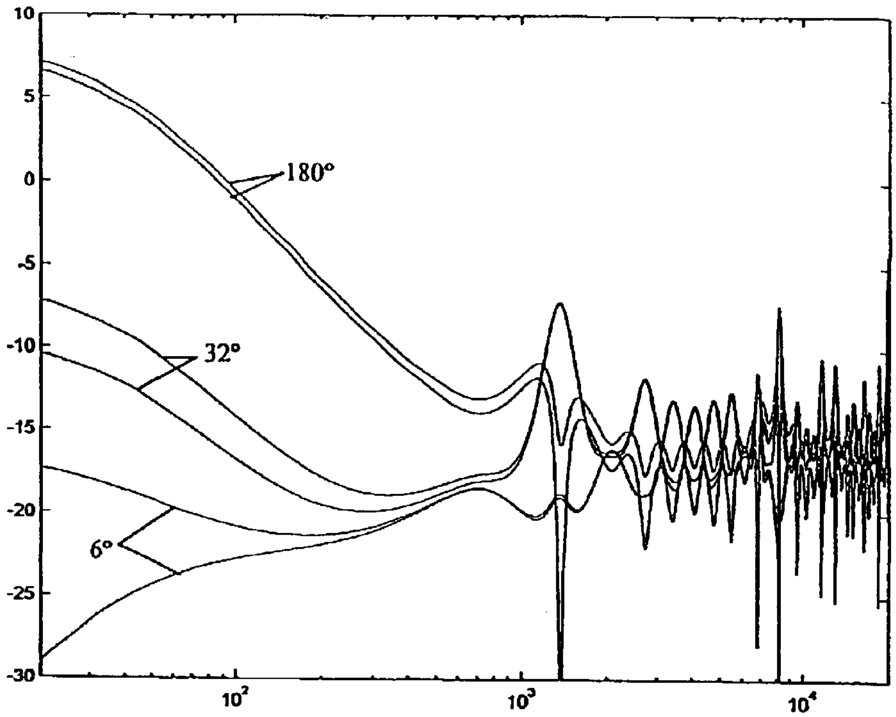
Fig. 30 An example of inverse filters for a multi-channel system (6 channels).

OPTIMAL SOURCE DISTRIBUTION

CROSS-REFERENCE TO RELATED APPLICATION

This application is a national stage application of prior International Application No. PCT/GB01/02759, filed Jun. 22, 2001, which claims the benefit of British application No. 200015419, filed Jun. 24, 2000, which are incorporated herein by reference.

The invention is particularly, but not exclusively, concerned with the stereophonic reproduction of sound whereby signals recorded at a plurality of points in the recording space such, for example, at the notional ear positions of a head, are reproduced in the listening space, by being replayed via a plurality of speaker channels, the system being designed with the aim of synthesising at a plurality of points in the listening space an auditory effect obtaining at corresponding points in the recording space.

1 INTRODUCTION

1.1 BACKGROUND TO THE INVENTION

Binaural technology [1]–[3] is often used to present a virtual acoustic environment to a listener. The principle of this technology is to control the sound field at the listener's ears so that the reproduced sound field coincides with what would be produced when he is in the desired real sound field. One way of achieving this is to use a pair of loudspeakers (electro-acoustic transducers) at different positions in a listening space with the help of signal processing to ensure that appropriate binaural signals are obtained at the listener's ears. [4]–[8]

We discuss hereafter in Section 2 a number of problems which arise from the multi-channel system inversion involved in such a binaural synthesis over loudspeakers. A basic analysis with a free field transfer function model illustrates the fundamental difficulties which such systems can have. The amplification required by the system inversion results in loss of dynamic range. The inverse filters obtained are likely to contain large errors around ill-conditioned frequencies. Regularisation is often used to design practical filters but this also results in poor control performance around ill-conditioned frequencies. Further analysis with a more realistic plant matrix, where the sound signals are controlled at a listener's ears in the presence of the listener's body (pinnae, head . . . ), demonstrates that this is still the case.

1.2 SUMMARIES OF THE INVENTION

According to one aspect of the invention a sound reproduction system comprises electro-acoustic transducer means, and transducer drive means for driving the electro-acoustic transducer means in response to a plurality of channels of a sound recording, the electro-acoustic transducer means comprising sound emitters which are spaced-apart in use, the transducer drive means comprising filter means that has been designed and configured with the aim of reproducing at a listener location an approximation to the local sound field that would be present at the listener's ears in recording space, taking into account the characteristics and intended positioning of the sound emitters relative to the ears of the listener, and also taking into account the head related transfer functions of the listener, wherein the electro-acoustic transducer means comprises at least two pairs of sound emitters, a first pair of said pairs of sound emitters being intended to be positioned more widely apart than a second of said pairs of sound emitters, said first pair of said emitters being suitable for use with a relatively lower frequency band, and said second pair of sound emitters being suitable for use with a higher frequency band, the arrangement being such that in use drive output signals in said lower frequency band are arranged to excite said first pair of sound emitters, and drive output signals in said second frequency band are arranged to excite said second pair of sound emitters.

Thus, we provide pairs of sound emitters that subtend different angles at the listener location, the angle depending on the frequency range of the sound emitted by the different pairs.

The sound emitters may be in the form of discrete transducers, such as conventional loudspeakers, or they may be constituted by area portions of an extended transducer means. Thus, the spacing of the pairs of emitter portions of the extended transducer could be arranged to vary continuously with frequency.

It should be appreciated that the invention does not preclude the use of additional electro-acoustic transducer means such as one or more sub-woofer units.

Preferably the operational transducer span-frequency range is determined by $$\Theta = 2\theta = 2\arcsin\left(\frac{n\pi}{2k\Delta r}\right) = 2\arcsin\left(\frac{nc_0}{4\Delta rf}\right) \text{ that is,} \tag{a}$$

$$f = \frac{nc_0}{4\Delta r\sin\theta} = \frac{nc_0}{4\Delta r\sin(\Theta/2)} \tag{b}$$

where $\Theta$ is the angle subtended at the listener by a pair of transducers, where $0<n<2$.

$c_0$: speed of sound ($\approx$340 m/s)

$\Delta r$: equivalent distance between the ears

The following equation is the correction factor to the foregoing equations (a) and (b) which are obtained from free field model, in order to match the frequency-span characteristics to the realistic case with the presence of head diffraction.

$$\Delta r = \Delta r_0(1+\Theta/\pi)$$

$\Delta r_0$: distance between the ears ($\approx$0.12~0.25 m)

Note that signal levels to define the operational frequency-span range should ideally be monitored at the receiver positions, not at the transducer input or output signals. Because there may be relatively large output signal level outside the operational frequency range for a transducer pair (much smaller than it would be without cross-over filters but may be larger compared to the case of multi-way conventional Stereo reproduction without system inversion) which will cancel each other due to the charactaristics of plant matrix to result in small signal level at the ears.

In the foregoing equation (a) n=substantially 1 is ideal, and a 'tolerance' of ±0.7 for example can be applied to produce a span-frequency range. Thus n=1 can be assigned to the centre frequency of the desired frequency range.

In one advantageous embodiment we employ $0<n<1.9$.

In another advantageous embodiment we employ $0<n<1.7$.

In yet another advantageous embodiment we employ $0.1<n<1.9$.

In a further advantageous embodiment we employ $0.3<n<1.7$.

(We can compromise upper frequency end but cannot in general compromise too much for the lower frequency end.)

Cross-over filters may be employed for distributing signals of the appropriate frequency range to the appropriate pairs of sound emitters. The cross-over filters may be arranged to respond to the outputs of an inverse filter means ($H_h$, $H_l$) of said filter means. Alternatively inverse filter means ($H_h$, $H_l$) of said filter means may be arranged to be responsive to the outputs ($d_H$, $d_l$) of the cross-over filters.

Preferably the second pair of sound emitters has a transducer span in the range 5.5° to 10°.

Most preferably the second pair of sound emitters has a transducer span in the range 6° to 8°.

The first pair of sound emitters preferably has a transducer span in the range 60° to 180°.

In one preferred arrangement the first pair of sound emitters has a transducer span in the range 110° to 130°.

In another preferred arrangement there are three pairs of sound emitters, a first pair having a span of 60° to 180°, a second pair having a span of 30° to 34°, and a third pair having a span of 6° to 8°.

The filter means may be configured to apply regularisation to the drive output signals in a frequency range at the lower end of the audio range.

A sub-woofer may be provided for responding to very low audio frequencies.

When the sound emitters are constituted by area portions of an extended transducer means, the extended transducer means preferably comprises a pair of elongate sound emitting members, the sound emitting surfaces of each member having a proximal end and a distal end, the proximal ends being adjacent to one another, excitation means mounted on said members adjacent to said proximal ends for imparting vibrations to said members in response to the drive output signals, the vibration transmission characteristics of the members being chosen such that the propagation of higher frequency vibrations along the members towards the distal end is inhibited whereby the proximal end of said surfaces is caused to vibrate at higher frequencies than the distal end.

1.3 BRIEF DESCRIPTION OF THE DRAWINGS

The invention will now be further described, by way of example only, with reference to the accompanying drawings, which show:

FIG. 1—Block diagram for multi-channel sound control with system inversion,

FIG. 2—The geometry of a 2-source 2-receiver system under investigation,

FIG. 3—Norm and singular values of the inverse filter matrix H as a function of $k\Delta r \sin\theta$. a) Logarithmic scale. b) Linear scale, FIG. 4—Dynamic range loss due to system inversion, FIG. 5—Dynamic range loss as a function of source span, FIG. 6—Condition number $\kappa(C)$ as a function of $k\Delta r \sin\theta$, FIG. 7—Dynamic range improvement and loss of control performance with regularisation, FIG. 8—Effect of changing source span. a) Larger source span. b) Smaller source span, FIG. 9—The principle of the "OSD" system. The relationship between source span and frequency for different odd integer number n, FIG. 10—Variable position (span)/frequency transducer, FIG. 11—Condition number $\kappa(C)$ of a free field plant matrix C as a function of source span and frequency, FIG. 12—Condition number $\kappa(C)$ of a HRTFs plant matrix C as a function of source span and frequency, FIG. 13—Dynamic range loss as a function of source span and frequency range, FIG. 14—Cross-talk cancellation performance as a function of source span and frequency with regularisation for 20 dB dynamic range loss, FIG. 15—The frequency/span region for systems with $n\approx1$ and $v=0.7$, and an example of discretisation for a 3-way system, FIG. 16—An example of 3-way system with $n\approx1$ and $v=0.7$, FIG. 17—an example of 3-way system with regularisation for 7 dB dynamic range loss, FIG. 18—an example of 3-way system with regularisation for 13 dB dynamic range loss, FIG. 19—The frequency/span region for systems with $n\approx1$ and $v=0.9$, and an example of discretisation for a 2-way system, FIG. 20—An example of 2-way system with $n\approx1$ and $v=0.9$, FIG. 21—An example of 2-way system with $n\approx1$ and $v=0.7$ with regularisation for 18 dB dynamic range loss, FIG. 22—The frequency/span region for systems with $n\approx1$ and $v=0.998$, and an example of discretisation for a 1-way system, FIG. 23—An example of 1-way system with $n\approx1$ and $v=0.998$, FIG. 24—An example of 1-way system with $n\approx1$ and $v=0.998$ with regularisation for 18 dB dynamic range loss, FIG. 25—The frequency/span region for a multi-region systems with $n\approx1$ and $n\approx3$ with $v=0.7$, and an example of discretisation for a 1-way system, FIG. 26—An example of 1-way multi-region system with $n\approx1$ and $n\approx3$ with $v=0.7$, with regularisation for 18 dB dynamic range loss, FIG. 27—Block diagrams for cross-over filters and inverse filters when a 2 by 2 plant matrix C is used to design inverse filters, FIG. 28—Block diagrams for cross-over filters and inverse filters when m (number of driver pairs) of 2 by 2 plant matrices C are used separately to design m inverse filter matrices, FIG. 29—Block diagrams for cross-over filters and inverse filters when a 2 by (2×m) plant matrix C is used to design inverse filters, and FIG. 30—An example of inverse filters for a multi-channel system (6 channels).

1.4 PRINCIPLES OF MULTI-CHANNEL SOUND CONTROL WITH SYSTEM INVERSION

System inversion is often used for multi-channel sound control. The principle of such systems is described below with 2-channel binaural reproduction over loudspeakers as an example for convenience in later analysis and is illustrated in FIG. 1. Independent control of two signals (such as binaural sound signals) at two points (such as the ears of a listener) can be achieved with two electro-acoustic transducers (such as loudspeakers), by filtering the input signals to the transducers with the inverse of the transfer function matrix of the plant. The signals and transfer functions involved are defined as follows. Two monopole transducers produce source strengths defined by the elements of the complex vector $v=[v_1(j\omega)\ v_2(j\omega)]^T$. The resulting acoustic pressure signals are given by the elements of the vector $w=[w_1(j\omega)\ w_2(j\omega)]^T$. This is given by $$w=Cv \quad (1)$$

where C is a matrix of transfer functions between sources and receivers. The two signals to be synthesised at the receivers are defined by the elements of the complex vector $d=[d_1(j\omega)\ d_2(j\omega)]^T$. In the case of audio applications, these signals are usually the signals that would produce a desired virtual auditory sensation when fed to the ears (FIG. 1). They can be obtained, for example, by recording sound source signals u with a recording head or filtering signals u by matrix of synthesised binaural filters A. Therefore, a filter matrix H which contains inverse filters is introduced so that v=Hd where $$H=\begin{bmatrix} H_{11}(j\omega) & H_{12}(j\omega) \\ H_{21}(j\omega) & H_{22}(j\omega) \end{bmatrix} \quad (1)$$

and thus $$w=CHd \quad (2)$$

For convenience in later analysis, we also define the control performance matrix R given by $$R=CH \quad (3)$$

The filter matrix H can be designed so that the vector w is a good approximation to the vector d with a certain delay. [9][10]

2 FUNDAMENTAL PROBLEMS OF PRIOR ART SYSTEMS

The system inversion involved gives rise to a number of problems such as, for example, loss of dynamic range and sensitivity to errors. A simple case involving the control of two monopole receivers with two monopole transducers (sources) under free field conditions is first considered here. The fundamental problems with regard to system inversion can be illustrated in this simple case where the effect of path length difference dominates the problem. A matrix of Head Related Transfer Functions (HRTFs) is also analysed as an example of a more realistic plant. In such a case, the acoustic response of the human body (pinnae, head, torso and so on) also comes to affect the problem. A symmetric case with the inter-source axis parallel to the inter-receiver axis is considered for an examination of the basic properties of the system. The geometry is illustrated in FIG. 2.

2.1 Inverse Filter Matrix

In the free field case, the plant transfer function matrix can be modelled as $$C=\frac{\rho_0}{4\pi}\begin{bmatrix} e^{-jkl_1}/l_1 & e^{-jkl_2}/l_2 \\ e^{-jkl_2}/l_2 & e^{-jkl_1}/l_1 \end{bmatrix} \quad (4)$$

where an $e^{j\omega}$ time dependence is assumed with $k=\omega/c_0$, and where $\rho_0$ and $c_0$ are the density and sound speed. When the ratio of and the difference between the path lengths connecting one source and two receivers are defined as $g=l_1/l_2$ and $\Delta l=l_2-l_1$, $$C=\frac{\rho_0 e^{-jkl_1}}{4\pi l_1}\begin{bmatrix} 1 & ge^{-jk\Delta l} \\ ge^{-jk\Delta l} & 1 \end{bmatrix} \quad (5)$$

Now consider the case $$d=\frac{\rho_0 e^{-jkl_1}}{4\pi l_1}\begin{bmatrix} D_1(j\omega) \\ D_2(j\omega) \end{bmatrix} \quad (6)$$

i.e., the desired signals are the acoustic pressure signals which would have been produced by the closer sound source and whose values are either $D_1(j\omega)$ or $D_2(j\omega)$ without disturbance due to the other source (cross-talk). This enables a description of the effect of system inversion as well as ensuring a causal solution. The elements of H can be obtained from the exact inverse of C and can be written as $$H=C^{-1}=\frac{1}{1-g^2e^{-2jk\Delta t}}\begin{bmatrix} 1 & -ge^{-jk\Delta l} \\ -ge^{-jk\Delta l} & 1 \end{bmatrix} \quad (7)$$

When $l>>\Delta r$, we have the approximation $\Delta l\approx\Delta r\sin\theta$ where $2\theta$ is the source span (hence $0<\theta\leqq(\pi/2)$) and under these conditions, $$H=\frac{1}{1-g^2e^{-2jk\Delta r\sin\theta}}\begin{bmatrix} 1 & -ge^{-jk\Delta r\sin\theta} \\ -ge^{-jk\Delta r\sin\theta} & 1 \end{bmatrix} \quad (8)$$

The magnitude of the elements of H ($|H_{mn}(j\omega)|$) show the necessary amplification of the desired signals produced by each inverse filter in H. The maximum amplification of the source strengths can be found from the 2-norm of H ($\|H\|$) which is the largest of the singular values of H, where these singular values are denoted by $\sigma_o$ and $\sigma_i$. Thus $$\|H\|=\max(\sigma_o,\sigma_i) \quad (9)$$

$$\text{where } \sigma_o=\frac{1}{\sqrt{(1-ge^{-jk\Delta r\sin\theta})(1-ge^{jk\Delta r\sin\theta})}}$$

$$\text{and } \sigma_i=\frac{1}{\sqrt{(1+ge^{-jk\Delta r\sin\theta})(1+ge^{jk\Delta r\sin\theta})}}$$

$\sigma_o$ and $\sigma_i$ are orthogonal components of the desired signals. $\sigma_o$ corresponds to the amplification factor of the out-of-phase component of the desired signals and $\sigma_i$ corresponds to the amplification factor of the in-phase component of the desired signals. Plots of $\sigma_0$, $\sigma_i$ and $\|H\|$ with respect to $k\Delta r \sin\theta$ are illustrated in FIG. 3. As seen in Eq. (9) and FIG. 3, $\|H\|$ changes periodically and has peaks where k and $\theta$ satisfy the following relationship with even values of the integer number n.

$$k\Delta r\sin\theta=\frac{n\pi}{2} \quad (10)$$

The singular value $\sigma_o$ has peaks at n=0, 4, 8, . . . where the system has difficulty in reproducing the out-of-phase component of the desired signals and $\sigma_i$ has peaks at n=2, 6, 10, . . . where the system has difficulty in reproducing the in-phase component.

2.2 Loss of Dynamic Range

In practice, since the maximum source output is given by $\|H\|_{max}$, this must be within the range of the system in order to avoid clipping of the signals. The required amplification results directly in the loss of dynamic range illustrated in FIG. 4. The level of the output source signal (v) and the resulting level of the acoustic pressure (w) are plotted both with and without system inversion assuming that the maximum output level and dynamic range of the system are the same. The given dynamic range is distributed into the system inversion and the remaining dynamic range which is to be used by the binaural auditory space synthesis, and also most importantly, by the sound source signal itself. The frequency of the peaks do not affect the amount of dynamic range loss but the magnitude of the peaks do. The dynamic range loss is defined by the difference between the signal level at the receiver with one monopole source and the signal level reproduced by two sources having the same maximum source strength when the system is inverted. Since $\|H\|$ here is nornalised by the case without system inversion by Eq. (6), the dynamic range loss Γ is given by $$\Gamma = \|H\|_{\max} = \frac{1}{1-g} \tag{11}$$

The dynamic range loss given by Eq. (11) as a function of source span is shown in FIG. 5. Since $g \approx 1 - \Delta r \sin\theta / l$, Γ can be approximated as $$\Gamma \approx \frac{l}{\Delta r \sin\theta} \tag{12}$$

as a function of θ. FIG. 5 and Eq. (12) show that the larger the source span, the less is the dynamic range loss.

2.3 Robustness to Error in the Plant and the Inverse Filters

Eq. (1) implies that the system inversion (which determines v and leads to the design of the filter matrix H) is very sensitive to small errors in the assumed plant C (which is often measured and thus small errors are inevitable) where the condition number of C, κ(C), is large. In addition, since $$v = C^{-1} w \tag{13}$$

and $\kappa(C^{-1}) = \kappa(C)$, the reproduced signals w are less robust to small changes in the inverse of the plant matrix $C^{-1}$, hence H, where κ(C) is large.

The condition number of C is given by $$\kappa(C) = \|C\|\|C^{-1}\| = \|C\|\|H\| = \|H^{-1}\|\|H\| \tag{14}$$

$$= \max\left( \sqrt{\frac{(1+ge^{-jk\Delta r\sin\theta})(1+ge^{jk\Delta r\sin\theta})}{(1-ge^{-jk\Delta r\sin\theta})(1-ge^{jk\Delta r\sin\theta})}}, \sqrt{\frac{(1-ge^{-jk\Delta r\sin\theta})(1-ge^{jk\Delta rs}}{(1+ge^{-jk\Delta r\sin\theta})(1+ge^{jk\Delta rs}}} \right.$$

and is shown in FIG. 6. As seen in Eq. (14) and FIG. 6, κ(C) has peaks where Eq. (10) is satisfied with an even value of the integer number n. The frequencies which give peaks of κ(C) are consistent with those which give the peaks of $\|H\|$.

Around the frequencies where κ(C) is large, the system is very sensitive to small errors in C and H. The calculated inverse filter matrix H is likely to contain large errors due to small errors in C and results in large errors in the reproduced signal w at the receiver. Even if C does not contain any errors, the reproduction of the signals at the receiver is too sensitive to the small errors in the inverse filter matrix H to be useful. On the contrary, κ(C) is small around the frequencies where n is an odd integer number in Eq. (10). Around these frequencies, a practical and close to ideal inverse filter matrix H is easily obtained. For the same value of n, the robust frequency range becomes lower as the source span becomes larger. With a logarithmic frequency scale, which is related to the perceptual attributes of the human auditory system, the frequency range of robust inversion is more or less constant for different source spans for the same value of n, even though it looks wider for smaller source spans on a linear frequency scale.

2.4 Regularisation

It is possible to reduce the excess amplification and hence the dynamic range loss by means of regularisation, where the pseudo inverse filter matrix H is given by $$H = [C^H C + \beta I]^{-1} C^H \tag{15}$$

where β is a regularisation parameter. The regularisation parameter penalises large values of H and hence limits the dynamic range loss of the system. Since $\|H\|$ is normalised by the case without system inversion by Eq. (6), the regularisation parameter limits the dynamic range loss to less than about $$\Gamma \approx -10\log_{10}\beta - 6(\text{dB}) \tag{16}$$

However, the regularisation parameter intentionally, hence inevitably, introduces a small error in the inversion process. This gives rise to a problem for filter design for frequencies where κ(C) is large. An example of this is illustrated in FIG. 7. The dynamic range loss is reduced by regularisation from about 27 dB (without regularisation) as in FIG. 7*a* to 14 dB as shown in FIG. 7*b* ($\beta = 10^{-2}$). However, it can be clearly seen that the control performance of the system deteriorates around the frequencies where n is an even integer number in Eq. (10). The contribution of the correct desired signals ($R_{11}$ and $R_{22}$) is reduced only slightly but the contribution of the wrong desired signals ($R_{12}$ and $R_{21}$, the cross-talk component) is increased significantly. In other words, the system has little control (cross-talk cancellation) around these frequencies. This problem is significant at lower frequencies (n<1 in Eq. (10)) in the sense that the region without cross-talk suppression is large, and at higher frequencies (n>1 in Eq. (10)), in the sense that there are many frequencies at which the plant is ill-conditioned. With an equivalent dynamic range loss, making the source span larger leads to a better control performance at lower frequencies but a poorer performance at higher frequencies (FIG. 8*a*). On the contrary, making the source span smaller leads to better control performance at higher frequencies but poorer performance at lower frequencies (FIG. 8*b*).

3 AN EXAMPLARY SYSTEM IN ACCORDANCE WITH THE INVENTION

As discussed above, there is a trade-off between dynamic range, robustness and control performance. However, a system which aims to overcome these fundamental problems is proposed in what follows and for convenience we refer to it as the optimal source distribution system.

3.1 Principle of the Proposed System 3.1.1 Principle of the Optimal Source Distribution ("OSD") System Eq. (10) can be rewritten in terms of the source span 2θ as $$2\theta = 2\arcsin\left(\frac{n\pi}{2k\Delta r}\right) \tag{17}$$

As seen from the analysis above, systems with the source span where n is an odd integer number in Eq. (17) give the best control performance as well as robustness. This implies the optimal source span must vary as a function of frequency.

We now consider a pair of conceptual monopole transducers whose span varies continuously as a function of frequency in order to satisfy the requirement for n to be an odd integer number in Eq. (17). This is illustrated in FIG. 9. The source span becomes smaller as frequency becomes higher. With this assumption, Eq. (8) becomes $$H = \frac{1}{1+g^2}\begin{bmatrix} 1 & -jg \\ -jg & 1 \end{bmatrix} \tag{18}$$

Note that $\|H\|=1/\sqrt{2}$ and $\kappa(C)=1$ for all frequencies. Therefore, there is no dynamic range loss compared to the case without system inversion. In fact, there is a dynamic range gain of 3 dB since the two orthogonal components of the desired signals are $\pi/2$ out of phase. The error in calculating the inverse filter is small and the system has very good control over the reproduced signals.

Also note that when $l \gg \Delta r$, $g \approx 1$ so $$H \approx \frac{1}{2}\begin{bmatrix} 1 & -j \\ -j & 1 \end{bmatrix} \tag{19}$$

This implies that independent control of the two signals is nearly achieved just by addition of the desired signals with a $\pi/2$ relative phase shift between them.

This principle requires a pair of monopole type transducers whose position varies continuously as frequency varies. This might, for example, be realised by exciting a triangular shaped plate whose width varies along its length. The requirement of such a transducer is that a certain frequency of vibration is excited most at a particular position having a certain width such that sound of that frequency is radiated mostly from that position (FIG. 10).

3.1.2 Extended Transducer

The variation in transducer width of the extended transducer shown in FIG. 10 will enable low frequencies to be effectively radiated from the wider part of the transducer and high frequencies to be radiated from the narrow part, since it is well-known in the field of acoustics that to obtain good efficiency of radiation at low frequencies it is necessary to increase the dimensions of the radiating area relative to the acoustic wavelength. Of course it would also be desirable that the vibrations of the surface of such a distributed transducer should be such that high frequencies of vibration were concentrated at the narrow end of the transducer illustrated in FIG. 10 and that low frequencies of vibration were concentrated at the wider end.

It is possible to ensure such behaviour of a vibrating surface (of a plate for example) by judicious choice of the mechanical damping of the vibrating transducer. Thus for example one could choose the damping of the vibrating transducer to ensure the rapid attenuation of high frequency vibrations when the transducer is excited at one end whilst ensuring the propagation of lower frequency vibrations to the other.

A similar effect can also be obtained, for example, by varying the stiffness of a plate along it's length. It is possible to construct a plate of variable thickness (rather than of variable width as shown in FIG. 10) which is clamped at the thicker end and which is excited at the thicker end. This will result in high frequency vibrations being concentrated at the thicker end whilst the thinner end will vibrate more at lower frequencies. Again it may be necessary to ensure judicious choice of damping to enable the correct spatial distribution of vibrations along such a plate of variable thickness.

It may also be advantageous to combine the effect on radiation efficiency of the plate of variable width shown in FIG. 10 with the effect of a plate of variable stiffness.

Other methods of changing the stiffness of the plate may be also used, such as adding ribs to the structure at certain intervals along it's length or by varying the thickness of the plate in discrete intervals rather than continuously.

There are many ways of adding damping to such a structure, such as through the use of a "constrained layer" or through the choice of the material from which the structure is fabricated. It is also possible to design a composite structure (from carbon fibre materials for example) where the stiffness and damping are controlled through the choice of laminations in the composite structure.

3.1.3 Aspects of the Proposed System

From Eq. (17), the range of source span is given by the frequency range of interest as can be seen from FIG. 9. A smaller value of n gives a smaller source span for the same frequency. Therefore, the smallest source span $\theta_h$ for the same high frequency limit is given by n=1 and this is about 4° to give control of the sound field at two positions separated by the distance between two ears (about 0.13 m for KEMAR dummy head) up to a frequency of 20 kHz.

Eq. (10) can also be rewritten in terms of frequency as $$f = \frac{nc_0}{4\Delta r \sin\theta} \tag{20}$$

The smallest value of n gives the lowest frequency limit for a given source span. Since $\sin\theta \leqq 1$, $$f \geq \frac{nc_0}{4\Delta r} \tag{21}$$

i.e., the physically maximum source span of 2θ=180° gives the low frequency limit, $f_l$, associated with this principle. A smaller value of n gives a lower low frequency limit so the system given by n=1 is normally the most useful among those with an odd integer number n. The low frequency limit given by n=1 of a system designed to control the sound field at two positions separated by the distance between two ears is about $f_l$=300~400 Hz.

3.2 Practical Discrete System

In practice, a pair of conceptual monopole transducers whose span varies continuously as a function of frequency is currently not available commercially. However, it is possible to realise a practical system based on this principle by discretising the transducer span. With a given span, the frequency region where the amplification is relatively small and plant matrix C is well conditioned is relatively wide around the optimal frequency. Therefore, by allowing n to have some width, say ±ν(0<ν<1 ), which results in a small amount of dynamic range loss and slightly reduced robustness, a certain transducer span can nevertheless be allocated to cover a certain range of frequencies where control performance and robustness of the system is still reasonably good. Consequently, it is possible to discretise the continuously varying transducer span into a finite number of transducer spans. Such a practical system can also be interpreted as making use of better-conditioned frequencies only and excluding ill-conditioned frequencies by limiting the frequency range to be used for a certain transducer span. By making use of different transducer spans for different frequency ranges, it is possible to construct a practical system which can cover a wide frequency range (most of the audible frequency range in fact) with a few sets of pairs of transducers with different transducer spans.

This principle is extremely useful and practical because a single transducer which can cover the whole audible frequency range is not practically available either. Therefore, this principle also gives the ideal background for multi-way systems for binaural reproduction over loudspeakers which maximise the frequency range to be covered. It should be noted that this is still a simple "2 channel" control system where only two independent control signals are necessary to control any form of virtual auditory space. This in principle can synthesise an infinite number of virtual source locations with different source signals with any type of acoustic response of the space. The difference from the conventional 2 channel system is that the two control signals are divided into multiple frequency bands and fed into the different pairs of driver units with different spans.

3.2.1 Frequency Range and Span for Discretised Transducer Pairs

The condition number κ(C) of the plant matrix plotted as a function of frequency and source span is shown in FIG. 11 for the audible frequency range (20 Hz~20 kHz). It is important to design the system to ensure a condition number that is as small as possible over a frequency range that is as wide as possible. Therefore, the transducer spans for each pair of transducers in each frequency range can be decided to ensure that the smallest possible values of v are used over the all frequency range of interest above $f_l$ (See 3.2.2)

FIG. 12 shows the condition number of the more realistic HRTF plant matrix. The HRTFs were measured with the KEMAR dummy head at MIT Media Lab [11] and the loudspeaker response was deconvolved later. A similar trend can clearly be seen as in the free field case. However, additional "ill-conditioned frequencies" can be observed around 9 kHz and 13 kHz where the HRTFs have minima. It is possible that the signal to noise ratio of the data around these frequencies is poor. It should also be noted that where the incidence angle θ is small, the peak frequencies obtained with the HRTF plant matrix are similar to that of the free field plant with the receiver distance Δr≈0.13. This corresponds to the shortest distance between the entrances of the ear canals of the KEMAR dummy head. However, where the incidence angle θ is large, the peak frequencies obtained with the HRTF plant matrix are similar to that of the free field plant with the receiver distance Δr≈0.25. This is a much larger distance than the shortest distance between the entrances of the ear canals of the KEMAR dummy head and is probably a result of diffraction around the head.

FIG. 13 shows the dynamic range loss as a function of frequency and source span. It is also possible to discretise, i.e., decide the transducer spans and frequency ranges to be covered by each pair of driver units (i.e. range of n), in terms of a tolerable dynamic range loss. The dynamic range loss of the entire system is now given by the maximum value among the values given by each discretised transducer span.

3.2.2 Consequence of the Discretisation of Variable Source Span

It should be noted that the low frequency limit $f_l$ given by odd integer numbers n in Eq. (21) is extended towards a lower frequency by discretisation because now the region for frequency and transducer span where n is not an integer number is also used. For example, a practical system discretised from the ideal system with n=i can now make use of the region 1−v<n<1+v so that the low frequency limit is given by n=1−v.

As can be seen from FIG. 9, in the higher frequency range where the source span is very small, the frequency range to be covered is very sensitive to small differences in transducer span. On the contrary, it is very insensitive to the source span at lower frequencies. Consequently, the range of practical span for the low frequency units is very large, which can practically be anywhere from 60° to 180° with only a very slight increase of $f_l$.

A system with a smaller n gives a wider region with the same performance on a logarithmic scale as can be seen in FIG. 11~FIG. 13.

3.2.3 Considerations for the Low Frequency Region

At the frequencies below $f_l$ (n<1−v) where κ(C) is larger than other frequencies, robustness of the system and the requirement for dynamic range loss are more severe than at other frequencies. When $f_l$ is reasonably low, where interaural difference is not crucial for binaural reproduction, one can avoid system inversion and simply add a single sub-woofer unit for this frequency region to avoid the extra dynamic range loss required by this region.

It is also possible to cover this sub-low frequency region with the lowest frequency pair of units by making use of regularisation to limit the amplification, and hence without too much dynamic range loss, without sacrificing robustness for other frequencies. The robustness to errors and cross-talk performance with regularisation in the frequency range below $f_l$ is not as good as the other frequencies as a result of the ill-conditioning of the plant matrix C. However, there can still be reasonable cross-talk suppression available.

The cross-talk cancellation performance in this region is very sensitive to the allocated dynamic range loss. If less dynamic range loss is allowed, a larger regularisation parameter is needed to suppress the amplitude of the inverse filter, and this results in cross-talk. Therefore, it is possible to design the system by selecting the required low frequency cross-talk cancellation performance. As an example, FIG. 14 illustrates the cross-talk cancellation performance as a function of frequency and source span when 20 dB dynamic range loss is allocated for system inversion. When more dynamic range loss is allowed, the greater is the cross-talk cancellation performance obtained for the whole frequency/span region.

When large dynamic range can not be allocated to system inversion, a large value of regularisation parameter is necessary. Even if reasonable cross-talk suppression is not available, the low frequency pair can still work as a sub-woofer. In this case, although the control performance deteriorates severely, ||R|| and hence the norm of the reproduced signal is the same as that without regularisation. This means that although the system has difficulty in reproducing the out-of-phase component of the desired signal, it still can produce the in-phase component as well as before. This is beneficial in binaural reproduction since the difference between the two desired signals are normally not so large and sometimes negligible in the very low frequency range.

3.3 Examples of Discrete (Multi-way) "OSD" System 3.3.1 "3-way" Systems and More Examples of 3-way systems with 0<n<2 are illustrated in FIG. 15. These examples aim to ensure a condition number that is as small as possible over a frequency range that is as wide as possible. Therefore, the transducer spans (2θ) for the high frequency units and the low frequency units were chosen at two extreme positions which gives v=0.7. A pair of high frequency units spanning 6.2° is chosen to cover the frequency range up to 20 kHz while a pair of low frequency units spanning 180° is chosen to cover as low a frequency as possible. The span for the mid frequency units is 32°. The dynamic range loss of about 7 dB can be achieved with 3 pairs of units (FIG. 16). This arrangement gives $f_l$≈110 Hz and a sub-woofer may be added to deal with the range below this frequency. The cross-over frequencies are at around 600 Hz and 4 kHz.

By limiting the amplification of the low frequency pair for frequencies below $f_l$ to 7 dB with regularisation, the low frequency units can also cover frequencies down to about 100 Hz with reasonable cross-talk cancellation of more than 20 dB and cover below 100 Hz with reduced interaural difference (FIG. 17).

When more dynamic range loss is allowed, it is possible to use smaller regularisation parameters hence low frequency cross-talk performance improves (FIG. 18). By allowing dynamic range loss of 13 dB, the low frequency units spanning 180° can cover frequencies down to 20 Hz with more than 20 dB cross-talk suppression.

Alternatively, it is possible to use a smaller v, i.e., transducer spans to improve the robustness of the system in the higher frequency range at the expense of the low frequency cross-talk performance, there being plenty to spare in the previous example (FIG. 18). An example of this strategy is described in the following section for "2-way" systems.

As the variable transducer span is discretised more finely, e.g., by using 4-way or 5-way systems and so on, the smaller the width of n (±v) becomes. Hence, the system becomes more robust at frequencies above $f_l$. However, the performance gain becomes smaller and smaller as the number of driver units is increased. Obviously, the finer the discretisation, the closer the design is to the principle of the continuously variable transducer span. However, the number of driver pairs increases and hence the trade-off between performance gain and cost becomes more significant.

3.3.2 "2-way" Systems

An example of a 2-way system with 0<n<2 is illustrated in FIG. 19 and FIG. 20. This example is again designed to ensure small condition numbers over a wide frequency range so the transducer spans were chosen at 6.9° and 120° which gives v≈0.9. A dynamic range loss of about 18 dB can be achieved with only 2 pairs of units without regularisation. A pair of mid-high frequency units spanning 6.9° is used to cover the frequency range up to 20 kHz while a pair of mid-low frequency units spanning 120° gives a value of $f_l$ of about 20 Hz. The cross-over frequency is at around 900 Hz.

As discretisation becomes coarser, the more frequency regions become severely ill-conditioned. It is possible to reduce transducer spans to improve robustness at higher frequencies at the expense of the low frequency cross-talk performance, FIG. 21 shows another example of a 2-way system which is obtained by omitting the pair of woofer units from the 3-way system (v≈0.7) described in the previous section. The dynamic range in this example is maintained to be the same as that in the previous example of the 2-way system (as in FIG. 20) by means of regularisation. The span for the high frequency units is 6.2°. The span for mid-low frequency units is 32° which also covers the frequency range below $f_l$=600 Hz with a cross-talk cancellation performance of more than 20 dB. The mid-low frequency pair can also cover the range below 200 Hz where the cross-talk cancellation performance becomes less than 20 dB. The cross-over frequency is now at around 4 kHz. The conditioning above $f_l$≈600 Hz is as good as the 3-way system and it can be seen that the condition number becomes very small compared to the previous example illustrated in FIG. 20.

3.3.3 "1-way" Systems

The coarsest discretisation is given by an example of a 1-way virtual acoustic imaging system with 0<n<2 as illustrated in FIG. 22 and FIG. 23. The transducer span is 7.2°. The benefit available is very limited for a 1-way system with this principle. Since the frequency range to be covered with a single pair of transducers is the whole audible frequency range (20 Hz~20 kHz), the width of n is nearly ±1 (v=0.998). The dynamic range loss is more than 40 dB and very large condition numbers are notable in the wide range of low frequencies and at the high frequency end. When regularisation is used to limit the dynamic range loss to 18 dB, the cross-talk cancellation performance below 1 kHz is less than 20 dB (FIG. 24).

This is not practical anyway since a practical single transducer which can be used over this frequency range is not available. It is possible to come to a compromise design to reduce the width of n (±v)by sacrificing the high and low frequency ranges which a practical full-range unit can not cover.

3.4 Comments on Multi-region Systems

It is also possible to compromise further to utilise two or more regions of n. Then there is no distinction from conventional systems. However, it is still possible to optimise their performance by utilising a similar discussion to that presented above but extending it into multiple regions of n. This approach is beneficial when one attempts to cover a wider frequency range with a smaller number of transducer pairs. The "Stereo Dipole" system [12] which has a pair of transducers spanning 10° is one such system. The simplest example with a single pair of transducers utilising the regions of 0<n<2 and 2<n<4 is illustrated in FIG. 25 and FIG. 26. The frequency range of 20 Hz~20 kHz is covered with a single pair of transducers spanning 14°. The required amplification is about 40 dB so the example illustrated is regularised to 18 dB dynamic range loss. It can be seen that the cross-talk cancellation performance in the low frequency range is improved from the 1-way system in FIG. 24. This example shows more than 20 dB cross-talk cancellation performance down to about 400 Hz (which was 1 kHz in FIG. 24). However, there is an additional unusable region around 10 kHz (1+v<n<3−v) where the system has little control and is not robust.

It is also possible to match this unusable region to the frequencies where HRTFs have minima (‖C‖ is small) since inversion of minima requires further amplification in H and dynamic range loss. In addition, the position of minima in the higher frequency range can vary considerably between individuals. [13] Therefore, it may not be practical to provide inversion at these frequencies where the HRTFs used for filter design have minima.

3.5 Considerations for Cross-over Filters and Inverse Filters

Cross-over filters (low pass, high pass or band pass filters) are used to distribute signals of the appropriate frequency range to the appropriate pair of driver units of the multi-way "OSD" system. Since an ideal filter which gives a rectangular window in the frequency domain can not be realised practically, there are frequency regions around the cross-over frequency where multiple pairs of driver units are contributing significantly to the synthesis of the reproduced signals w. Therefore, it is important to ensure this "cross-over region" is also within the region of this principle.

3.5.1 "2 by 2" Plant Matrix

If the plant matrix C is obtained when including a cross-over network as illustrated in FIG. 27, it consists of a single 2 by 2 matrix of electro-acoustic transfer functions between two outputs of the filter matrix H and two receivers which contain the responses of the cross-over networks and the interaction between different pairs of driver units around the cross-over frequency. The plant matrix C for inverse filter design can also contain the transducer responses and the acoustic response of human body and the surrounding environment. The obtained 2 by 2 inverse filter matrix H designed from this plant matrix C automatically compensates for all those responses contained in order to synthesise the correct desired signals at the listener's ears.

3.5.2 Multiple "2 by 2" Plant Matrix

Alternatively, one can design inverse filter matrices $H_1$, $H_2$, . . . for plants $C_1$, $C_2$, . . . of each pair of driver units (FIG. 28). The cross-over filters for each pair of driver units ensure that the signals contain the corresponding frequency range of the signals for the particular pair of units. In this case, around cross-over frequencies, a virtual acoustic environment is synthesised with two different inverse filter matrices. Since both reproduced signals at the ears synthesised with both pairs of driver units are correct, the correct desired signals are reproduced at the ears as a simple sum of those two (identical but different in level) desired signals, provided that the cross-over filters behave well. Since the system inversion is now independent of the cross-over filters, the cross-over filters can also be applied to signals prior to the input to the inverse filters which can be after (FIG. 28*b*) or even before the binaural synthesis.

3.5.3 "2 by (2×Multiple)" Plant Matrix

It is also possible to obtain the plant matrix C as a 2 by (2×m) matrix where m is a number of driver pairs (FIG. 29). The system is underdetermined and a (2×m) by 2 matrix of the pseudo inverse filter matrix H is given by $$H=C^H[CC^H+\beta I]^{-1} \quad (22)$$

where β is a regularisation parameter. This solution ensures that the "least effort" (smallest output) of the transducers is used in providing the desired signals at the listener's ears. The net result is similar to the case with a single 2 by 2 plant matrix inversion described in section 3.5.1.

3.5.4 Type of Filters

In any case, the cross-over filters can be passive, active or digital filters. Obviously, when the cross-over filters are applied prior to the inverse filters, they can also be applied prior to the binaural synthesis filters A in FIG. 1. If they are digital filters, they can also be included in the same filters which implement the system inversion in the exactly the same way as the filters for binaural synthesis. As Eq. (19) suggests, the inverse filter matrix H can also be realised as analogue (active or passive) filters when the "OSD" principle is approximated reasonably well by means of fine discretisation or an ideal variable transducer such as that depicted in FIG. 10.

3.6 Comments on Multi-channel Systems

When the cross-over filters are not used, then the problem becomes a conventional multi-channel system, contrary to the "OSD" system which is multi-way system. In this case where mn is a number of driver pairs, the plant matrix is again a 2 by (2×m) matrix of electro-acoustic transfer functions between (2×m) outputs of the filter matrix H and 2 receivers where (2×m) is the number of channels. The pseudo inverse filter matrix H is given by Eq. (22). The obtained inverse filter matrix H is a (2×m) by 2 matrix which distributes signals automatically to different drivers so that least effort is required. As an example, the magnitude of the elements of H ($|H_{mn}(j\omega)|$) which has 6 channels of transducers at the same position as the drivers used for the examples of the 3-way "OSD" systems with v=0.7 are plotted in FIG. 30. The property of multi-channel inversion is beneficial in that frequencies at which there are problems such as ill-conditioning and minima of HRTFs are automatically avoided. On the other hand, with the absence of the cross-over filters, multi-channel systems do not have some of the merit of the "OSD" system.

One of the important advantages is that of the "OSD" system being a multi-way system. The inversion of multi-channel systems ensures that most of the lower frequency signals are distributed to the pair of units with larger span since the condition numbers of the pair are always smaller than the loudspeaker pairs with smaller span at low frequencies. However, some of the higher frequency signals are also distributed to the pairs of units with larger span since there are a number of frequencies for which the larger span gives a smaller condition number due to its periodic nature. This requires the pairs with larger span to produce a very wide frequency range of signals, which is not practical.

Another merit of the "OSD" system, which being a 2-channel system, is also lost in a multi-channel system. Only two independent output signals, hence only two channels of amplifiers, are required for a passive cross-over "OSD" system whereas the same number of channels of amplifiers as number of driver units are always required for a multi-channel system.

4. SUMMARY

A new 2-channel sound control system has been described which overcomes the fundamental problems with system inversion by utilising a variable transducer span.

This system can most easily be realised in practice by discretising the theoretical continuously variable transducer span which results in multi-way sound control system.

Even though basic principles and properties have been explained with a 2-channel system as an example, the same principle can be applied to multi-channel case as multi-way multi-channel systems.

When the variable transducer span is well approximated, it may be possible to achieve a virtual source synthesis with a simple gain change and phase shift.

What is claimed is:

1. A sound reproduction system comprising electro-acoustic transducer means, and transducer drive means for driving the electro-acoustic transducer means in response to a plurality of channels of a sound recording, the electro-acoustic transducer means comprising sound emitters which are spaced-apart in use, the transducer drive means comprising filter means (H) that has been designed and configured with the aim of reproducing at a listener location ($w_1$, $w_2$) an approximation to the local sound field that would be present at the listener's ears in recording space, taking into account the characteristics and intended positioning of the sound emitters relative to the ears of the listener, and also taking into account the head related transfer functions of the listener, wherein the electro-acoustic transducer means comprises at least two pairs of sound emitters, a first pair of said pairs of sound emitters being intended to be positioned more widely apart than a second of said pairs of sound emitters, said first pair of said emitters being suitable for use with a relatively lower frequency band, and said second pair of sound emitters being suitable for use with a higher frequency band, the arrangement being such that in use drive output signals in said lower frequency band are arranged to excite said first pair of sound emitters, and drive output signals in said second frequency band are arranged to excite said second pair of sound emitters, characterised in that the operational transducer span-frequency range is determined by an equation of the form $$f = \frac{(n \pm v)c_0}{4\Delta r \sin(\Theta/2)}$$

where the transducer span Θ is the angle subtended at the listener by a pair of transducers, where n is an odd integer, $c_0$: is the speed of sound, $\Delta r$: is the equivalent distance between the ears, and $v \leqq 0.7$.

2. A sound reproduction system as claimed in claim 1, in which head diffraction correction factor is applied to the value of the equivalent distance Δr between the ears, by using the equation $$\Delta r = \Delta r_0(1 + \Theta/\pi), \quad \text{where}$$

$\Delta r_0$ is the actual distance between the ears.

3. A sound reproduction system as claimed in claim 1 or claim 2 in which n=1.

4. A sound reproduction system as claimed in claim 1 in which the sound emitters are constituted by area portions of an extended transducer means.

5. A sound reproduction system as claimed in claim 4, in which the extended transducer means comprises a pair of elongate sound emitting members, the sound emitting surfaces of each member having a proximal end and a distal end, the proximal ends being adjacent to one another, excitation means mounted on said members adjacent to said proximal ends for imparting vibrations to said members in response to the drive output signals, the vibration transmission characteristics of the members being chosen such that the propagation of higher frequency vibrations along the members towards the distal end is inhibited whereby the proximal end of said surfaces is caused to vibrate at higher frequencies than the distal end.

6. A sound reproduction system as claimed in claim 4 or claim 5 in which the spacing of the pairs of emitter portions of the extended transducer is arranged to vary continuously with frequency.

7. A sound reproduction system as claimed in claim 1 or claim 2 in which the transducer drive means comprises cross-over filters for distributing signals of the appropriate frequency range to the appropriate pairs of sound emitters, the cross-over filters responding to the outputs of an inverse filter means ($H_h$, $H_l$) of said filter means.

8. A sound reproduction system as claimed in claim 1 or claim 2 in which the transducer drive means comprises cross-over filters for distributing signals of the appropriate frequency range to the appropriate pairs of sound emitters, inverse filter means ($H_h$, $H_l$) of said filter means being responsive to the outputs ($d_H$, $d_l$) of the cross-over filters.

9. A sound reproduction system as claimed in claim 1 or claim 2 in which the second pair of sound emitters has a transducer span in the range 5.5° to 10°.

10. A sound reproduction system as claimed in claim 9, in which the second pair of sound emitters has a transducer span in the range 6° to 8°.

11. A sound reproduction system as claimed in claim 10, in which the first pair of sound emitters has a transducer span in the range 60° to 180°.

12. A sound reproduction system as claimed in claim 11, in which the first pair of sound emitters has a transducer span in the range 110° to 130°.

13. A sound reproduction system as claimed in claim 1 or claim 2 comprising three pairs of sound emitters, a first pair having a span of 60° to 180°, a second pair having a span of 30° to 34°, and a third pair having a span of 6° to 8°.

14. A sound reproduction system as claimed in claim 1, 2, 4, or 5, in which the filter means is configured to apply regularisation to the drive output signals in a frequency range at the lower end of the audio range.

15. A sound reproduction system as claimed in claim 1, 2, 4, or 5, comprising a sub-woofer for responding to very low audio frequencies.

* * * * *